(12) United States Patent
Fukunaka

(10) Patent No.: US 10,698,005 B2
(45) Date of Patent: Jun. 30, 2020

(54) MAGNETIC DETECTION DEVICE, CURRENT DETECTION DEVICE, METHOD FOR MANUFACTURING MAGNETIC DETECTION DEVICE, AND METHOD FOR MANUFACTURING CURRENT DETECTION DEVICE

(71) Applicant: Asahi Kasei Microdevices Corporation, Tokyo (JP)

(72) Inventor: Toshiaki Fukunaka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 64 days.

(21) Appl. No.: 15/956,744

(22) Filed: Apr. 19, 2018

(65) Prior Publication Data
US 2018/0306842 A1  Oct. 25, 2018

(30) Foreign Application Priority Data

Apr. 20, 2017 (JP) .................................. 2017-084060
Apr. 17, 2018 (JP) .................................. 2018-079140

(51) Int. Cl.
*G01R 15/20* (2006.01)
*H01L 23/00* (2006.01)
*H01L 23/495* (2006.01)

(52) U.S. Cl.
CPC ......... *G01R 15/202* (2013.01); *G01R 15/207* (2013.01); *H01L 24/49* (2013.01); *H01L 24/85* (2013.01); *H01L 23/49541* (2013.01); *H01L 23/49548* (2013.01); *H01L 24/45* (2013.01); *H01L 24/48* (2013.01); *H01L 2224/05554* (2013.01); *H01L 2224/45144* (2013.01);
(Continued)

(58) Field of Classification Search
CPC ..... G01R 15/202; G01R 15/207; H01L 24/49; H01L 24/85; H01L 24/0652; H01L 24/48; H01L 24/45; H01L 224/85005
See application file for complete search history.

(56) References Cited

U.S. PATENT DOCUMENTS 9,601,455 B2 * 3/2017 Nishiyama .......... H01L 23/3121
2004/0155644 A1 8/2004 Stauth et al.
(Continued)

FOREIGN PATENT DOCUMENTS

JP    2002202326 A    7/2002
JP    2003004771 A    1/2003
(Continued)

*Primary Examiner* — Dominic E Hawkins

(57) ABSTRACT

A current sensor (current detection device) 100 includes a conductor 10 through which measurement-target current flows, a magnetic sensor 30 that detects magnetic fields generated by current flowing through the conductor and a package 60 that, together with at least part of the conductor, separates the magnetic sensor from the conductor and covers and seals in their outer surfaces. Together with a curved portion 13 of the conductor, the package separates, from the conductor through which measurement-target current flows, the magnetic sensor that detects magnetic fields generated by current flowing through the conductor and covers and seals in their outer surfaces so that an interface that can spread in the package, in which the magnetic sensor is embedded, from its boundaries with it is not formed; therefore, a high withstand voltage can be obtained.

10 Claims, 18 Drawing Sheets

(52) U.S. Cl.
CPC ......... *H01L 2224/45147* (2013.01); *H01L 2224/48091* (2013.01); *H01L 2224/48137* (2013.01); *H01L 2224/48195* (2013.01); *H01L 2224/48247* (2013.01); *H01L 2224/4912* (2013.01); *H01L 2224/85005* (2013.01); *H01L 2924/181* (2013.01)

(56) References Cited

U.S. PATENT DOCUMENTS

| | | | |
|---|---|---|---|
| 2009/0121704 A1* | 5/2009 | Shibahara | G01R 15/202 324/117 R |
| 2009/0293294 A1* | 12/2009 | Kitaura | G01R 33/0206 33/355 R |
| 2010/0062709 A1* | 3/2010 | Kato | G01R 29/0878 455/41.1 |
| 2011/0193557 A1 | 8/2011 | Motz et al. | |
| 2011/0202295 A1* | 8/2011 | Tamura | G01R 15/20 702/64 |
| 2014/0151697 A1 | 6/2014 | Ausserlechner et al. | |
| 2014/0167736 A1 | 6/2014 | Suzuki et al. | |
| 2016/0183377 A1* | 6/2016 | Ottobon | G06K 19/07747 361/767 |
| 2016/0187388 A1* | 6/2016 | Suzuki | G01R 19/0092 324/244 |
| 2017/0082659 A1 | 3/2017 | Harada | |
| 2017/0131329 A1 | 5/2017 | Gorai et al. | |
| 2017/0160313 A1 | 6/2017 | Koiwa et al. | |

FOREIGN PATENT DOCUMENTS

| | | |
|---|---|---|
| JP | 2010266469 A | 11/2010 |
| JP | 2013245942 A | 12/2013 |
| JP | 2015172531 A | 10/2015 |
| JP | 2015179042 A | 10/2015 |
| JP | 2015179043 A | 10/2015 |
| JP | 2017040591 A | 2/2017 |

\* cited by examiner

MAGNETIC DETECTION DEVICE, CURRENT DETECTION DEVICE, METHOD FOR MANUFACTURING MAGNETIC DETECTION DEVICE, AND METHOD FOR MANUFACTURING CURRENT DETECTION DEVICE The contents of the following Japanese patent applications are incorporated herein by reference:
  NO. 2017-084060 filed in JP on Apr. 20, 2017, and
  NO. 2018-079140 filed in JP on Apr. 17, 2018.

BACKGROUND

1. Technical Field

The present invention relates to a magnetic detection device, a current detection device, a magnetic detection device manufacturing method and a current detection device manufacturing method.

2. Related Art

Magnetic detection devices that detect the strengths of magnetic fields using magnetic sensors and current detection devices (also called current sensors) that detect the amounts of currents have been known. For example, Patent Document 1 discloses a current sensor including: a primary conductor to which measurement-target current is input; a secondary conductor that supports a signal processing IC; a magnetic sensor that is supported on an insulating tape placed across two projecting portions of the secondary conductor and is arranged in a gap of the primary conductor in the plan view; and a package that seals in these respective constituent portions. If a current is input to the primary conductor, the current sensor detects magnetic fields generated around the primary conductor by the current using the magnetic sensor and outputs an output signal corresponding to the amount of the current.
  Patent Document 1: WO2015/015539

In the thus-configured current detection devices and magnetic detection devices, high dielectric withstand capabilities are asked for.

SUMMARY

A first aspect of the present invention provides a magnetic detection device including: a magnetic sensor that detects a magnetic field; and a sealing member that covers and seals in all outer surfaces of the magnetic sensor.

A second aspect of the present invention provides a current detection device including: the magnetic detection device according to the first aspect; and a conductor through which measurement-target current flows, wherein the magnetic sensor detects a magnetic field generated by current flowing through the conductor, and the sealing member seals in at least part of the conductor to separate the magnetic sensor from the conductor.

A third aspect of the present invention provides a current detection device including: a conductor that has a roughened bottom surface and through which measurement-target current flows; a magnetic sensor that detects a magnetic field generated by current flowing through the conductor; and a sealing member that seals in at least part of the conductor and the magnetic sensor.

A fourth aspect of the present invention provides a magnetic detection device manufacturing method including: arranging, on a support member, a magnetic sensor that detects a magnetic field; sealing in an upper surface of the magnetic sensor by a first sealing member; removing the support member; and sealing in a bottom surface of the magnetic sensor by a second sealing member.

A fifth aspect of the present invention provides a current detection device manufacturing method including: arranging, on a support member and separately from each other, a conductor through which measurement-target current flows and a magnetic sensor that detects a magnetic field generated by current flowing through the conductor; sealing in, by a first sealing member, at least part of the conductor and an upper surface of the magnetic sensor; removing the support member; and sealing in, by a second sealing member, at least part of the conductor and a bottom surface of the magnetic sensor.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1A:
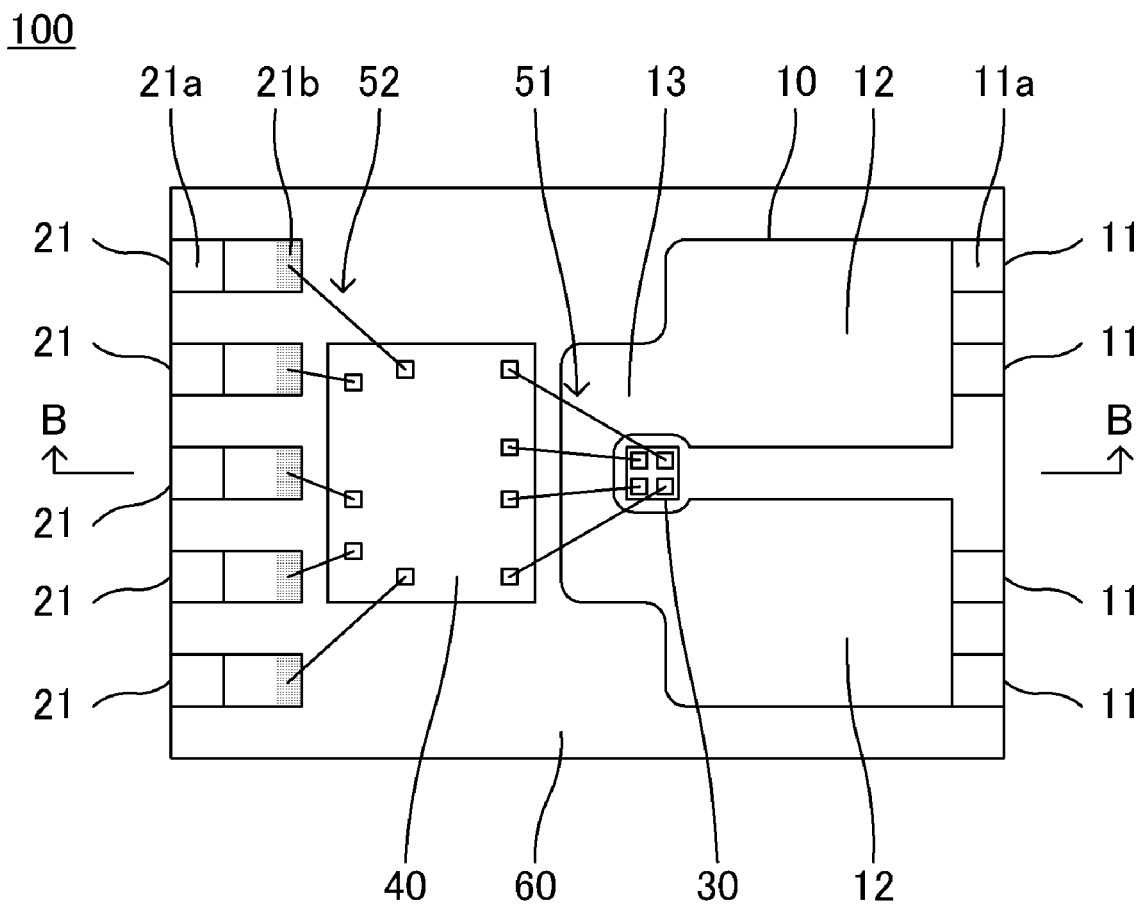
FIG. 1A shows the internal configuration of a current sensor according to the present embodiment.
Figure 1B:
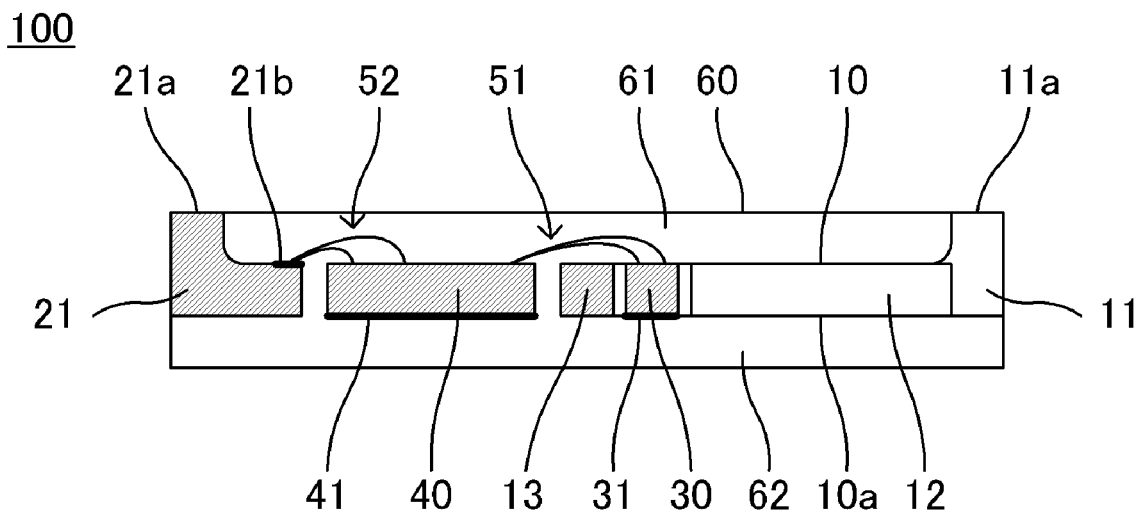
FIG. 1B shows the configuration of the current sensor as seen in a cross section taken along a reference line BB in FIG. 1A.

FIG. 1A and FIG. 1B show the configuration of a current sensor 100 according to the present embodiment. Here, FIG. 1A shows the internal configuration of the current sensor 100 in the plan view, and FIG. 1B shows the configuration of the current sensor 100 as seen in a cross section taken along a reference line BB in FIG. 1A. The upward-downward direction in FIG. 1A is treated as the longitudinal direction, the leftward-rightward direction in FIG. 1A and FIG. 1B is treated as the lateral direction, and the upward-downward direction in FIG. 1B is treated as the height direction. In addition, FIG. 1A and FIG. 1B, and other figures corresponding to these figures represent the internal configuration of the current sensor 100 that is seen (imaginarily) through a package 60 (first and second sealing members 61, 62). The current sensor 100 is one example of a current detection device an objective of which is to provide a current sensor with a high dielectric withstand capability, and includes a conductor 10, a plurality of device terminals 21, a magnetic sensor 30, a signal processing IC 40, wires 51, 52 and the package 60.

The conductor 10 is a conductive member in which current to be detected by the current sensor 100 (called measurement-target current) flows along a current path. In order to cause a large measurement-target current to flow therein, the conductor 10 is shaped into a shape for example using a conductor such as a metal like copper to be 0.2 mm-thick, but to be 0.4 mm-thick at terminal portions 11 such that it extends from one set among two sets of the terminal portions 11, which are provided on the laterally right side, passes through the inside of the package 60 mentioned below and returns to the other set. The conductor 10 includes the two sets of terminal portions 11, two leg portions 12 and a curved portion 13.

The two sets of terminal portions 11 are current terminals through which measurement-target current is input and output, and are arranged at predetermined positions on the laterally right side, separately in the longitudinal direction. The two sets of terminal portions 11 have approximately rectangular shapes in the plan view, and each couple of terminal portions 11 included in the two sets of terminal portions 11 is connected integrally to the right end of the corresponding one among the two leg portions 12, with the thickness of each terminal portion 11 being reduced at its base end (that is, the left end). The number of the terminal portions 11 in each set is not limited to two, but three or more terminal portions 11 may be included in each set.

The two leg portions 12 are members that transmit current input to one set of terminal portions 11 among the two sets of terminal portions 11 to the curved portion 13 or transmit current from the curved portion 13 to the other set of terminal portions 11, and are arranged at predetermined positions on the left side of the two sets of terminal portions 11, separately in the longitudinal direction. The two leg portions 12 have rectangular shapes having longitudinal sides extending in the lateral direction in the plan view, and connect integrally the two sets of terminal portions 11 respectively connected at their right ends to two end portions of the curved portion 13, respectively.

The curved portion 13 is a member to transmit current that flows in from one of the two leg portions 12 out to the other leg portion 12 after reversing the direction of the current, and are arranged at predetermined positions on the left side of the two leg portions 12. The curved portion 13 is, in the plan view, shaped into a U-shape having a trunk portion and two end portions that are arranged side-by-side with the trunk portion therebetween, and the two end portions are connected integrally to the two leg portions 12, respectively, with the trunk portion being shifted leftward. Here, the width of the space formed on the inner side of the curved portion 13 is larger than the width of the magnetic sensor 30.

A bottom surface 10a of the conductor 10 may be roughened. Here, the arithmetic mean roughness (Ra) of the roughened bottom surface 10a is made equal to or higher than 0.01 μm. Thereby, the package 60 to seal in the conductor 10 closely contacts the bottom surface 10a of the conductor 10 to suppress formation of an interface.

On the upper surfaces of thin portions (that is, the leg portions 12 and curved portion 13) of the conductor 10 excluding upper surfaces 11a of its thick portions (that is, the terminal portions 11), plating films may be provided for example using silver.

The conductor 10 is sealed in the package 60 with the upper surfaces and tip surfaces (that is, the right end surfaces) of the terminal portions 11 respectively included in the two sets of terminal portions 11 being exposed flush at the upper surface and right side surface of the package 60. If the current sensor 100 is implemented for example on an external substrate, the upper surfaces 11a of the terminal portions 11 are joined with wires or the like arranged at predetermined positions on the external substrate. Measurement-target current is input through one set of terminal portions 11 which is the upper (or lower) one in the longitudinal direction, changes its direction by 180 degrees from left to right by flowing through the curved portion 13 after flowing through the upper (or lower) leg portion 12 and is output through the other set of terminal portions 11 which is the lower (or upper) one, after flowing through the lower (or upper) leg portion 12. A path through which measurement-target current flows in the conductor 10 is called a current path.

The plurality of device terminals 21 are signal terminals through which calculation results of the amount of current output from the signal processing IC 40 are output to an external device and through which signals for setting correction parameters are input from an external device to the signal processing IC 40. The plurality of device terminals 21 include five terminals as one example, and are arranged at predetermined positions on the laterally left side, separately in the longitudinal direction. Each among the plurality of device terminals 21 is shaped into a rectangular shape for example using a conductor such as a metal like copper to be 0.2 mm-thick, but to be 0.4 mm-thick at its left end portion, the rectangular shape having longitudinal sides extending in the lateral direction.

On the upper surfaces of thin portions of the plurality of device terminals 21 excluding the upper surfaces 21a of its thick portions (that is, left end portions), plating films may be provided for example using silver.

The plurality of device terminals 21 are sealed in the package 60 with the upper surfaces 21a and tip surfaces (that is, the left end surfaces) of their left end portions being exposed flush at the upper surface and left side surface of the package 60. If the current sensor 100 is implemented for example on an external substrate, the upper surfaces 21a of the device terminals 21 are joined with wires or the like arranged at predetermined positions on the external substrate.

The magnetic sensor 30 is one example of a magnetic detection element that detects magnetic fields generated by current flowing through the conductor 10. As the magnetic sensor 30, for example, a compound semiconductor Hall element configured with InAs, GaAs or the like, a Hall element configured with silicon (or a Hall IC integrated with an amplifier circuit) or a magnetoresistive element can be employed. The magnetic sensor 30 is arranged on the inner side of the curved portion 13 of the conductor 10, preferably at the center of curvature of a current path in the curved portion 13. Thereby, magnetic fields generated by current flowing through the curved portion 13 converge at the magnetic sensor 30, and it becomes possible to detect the magnetic fields with the magnetic sensor 30 at a high S/N ratio. If magnetic fields are desired to be detected at a still higher S/N ratio, the thickness of the magnetic sensor 30 is preferably thinner than the thickness of the conductor 10.

An insulating member 31 may be provided to the bottom surface of the magnetic sensor 30. The insulating member 31 may be roughened, and its arithmetic mean roughness (Ra) is made equal to or higher than 0.01 µm. As the insulating member 31, for example, a die attach film to be pasted onto the rear surface of a wafer if the wafer is diced to singulate circuit elements of the magnetic sensor 30 formed on the wafer can be employed. Because the bottom surface of the magnetic sensor 30 is protected by the insulating member 31 (for example, at the time of wet-blasting mentioned below), and the insulating member 31 is roughened at the arithmetic mean roughness (Ra) which is equal to or higher than 0.01 µm, formation of an interface can be suppressed by the package 60 being closely contacting the bottom surface of the magnetic sensor 30 and sealing it in. If a method such as plasma treatment which does not cause significant damages to the bottom surface of the magnetic sensor 30 is used, and there is no necessity for protection, the insulating member 31 may not be present.

Magnetic bodies formed through magnetic body-plating may be provided to the upper side, lower side or both sides of the magnetic sensor 30, and magnetic fields may be caused to enter the magnetic sensor 30 after being converged by them. In addition, the upper surface, bottom surface or both surfaces of the magnetic sensor 30 may be electrostatic-shielded for example using a nonmagnetic conductor such as aluminum to block electrostatic noises coming from the outside of the package 60.

In order to eliminate noises accompanying external magnetic fields or the like entering the magnetic sensor 30, an additional magnetic sensor for detecting the external magnetic fields may be provided outside the curved portion 13 of the conductor 10. In such a case, by calculating the difference between a detection signal of the magnetic sensor 30 and a detection signal of the additional magnetic sensor with the signal processing IC 40, noises attributable to the external magnetic fields or the like included in the detection signal of the magnetic sensor 30 can be cancelled out.

The magnetic sensor 30 is connected to the signal processing IC 40 by wire-bonding, and outputs, to the signal processing IC 40, a voltage corresponding to the strengths of detected magnetic fields as an output signal.

The signal processing IC 40 is a device that processes signals output by the magnetic sensor 30 to calculate the amount of current flowing through the conductor 10. The signal processing IC 40 may have therein at least one of: a memory; a sensitivity correction circuit; an offset correction circuit that corrects the offset of an output; an amplifier circuit that amplifies an output signal from the magnetic sensor 30; a temperature correcting circuit that corrects an output according to temperature; and the like. In the present embodiment, a device configured hybridly as a device separate from the magnetic sensor 30 is employed as the signal processing IC 40. The signal processing IC 40 is arranged between the curved portion 13 of the conductor 10 and the plurality of device terminals 21.

The bottom surface of the signal processing IC 40 may be provided with an insulating member 41. The insulating member 41 may be roughened, and its arithmetic mean roughness (Ra) is made equal to or higher than 0.01 µm. As the insulating member 41, for example, a die attach film to be pasted onto the rear surface of a wafer if the wafer is diced to singulate circuit elements of the signal processing IC 40 formed on the wafer can be employed. Because the bottom surface of the signal processing IC 40 is protected by the insulating member 41 (for example, at the time of wet-blasting mentioned below), and the insulating member 41 is roughened at the arithmetic mean roughness (Ra) which is equal to or higher than 0.01 μm, formation of an interface can be suppressed by the package 60 being closely contacting the bottom surface of the signal processing IC 40 and sealing it in.

Although in the present embodiment shown, the signal processing IC 40 is not supported by a lead frame or the like, the signal processing IC 40 may be placed for example on a lead frame. In addition, the insulating member 41 may not be present as mentioned above.

The signal processing IC 40 is connected to the plurality of device terminals 21 by wire-bonding, and through the plurality of device terminals 21, outputs calculation results of the amount of current flowing through the conductor 10 and further receives input of parameter setting and the like. Any of the plurality of device terminals 21 may be used as a ground terminal. In addition, the upper surface, bottom surface or both surfaces of the signal processing IC 40 may be electrostatic-shielded for example using a nonmagnetic conductor such as aluminum to block electrostatic noises coming from the outside of the package 60.

Although in the current sensor 100 according to the present embodiment, the signal processing IC 40 configured hybridly as a device separate from the magnetic sensor 30 is employed, instead of this, a signal processing IC including a signal processing circuit formed on a semiconductor substrate on which the magnetic sensor 30 is formed as well, that is, a signal processing IC configured monolithically together with the magnetic sensor 30 may be employed. In such a case, the curved portion 13 of the conductor 10 is arranged above or below the semiconductor substrate with clearance being provided therebetween, the magnetic sensor 30 on the semiconductor substrate is positioned, in the plan view, on the inner side of the curved portion 13 of the conductor 10, the semiconductor substrate is separated from the conductor 10 by the package 60 and all the outer surfaces of the semiconductor substrate are covered and sealed in by the package 60. In addition, a hybrid signal processing IC in which the magnetic sensor 30 and signal processing IC 40 are mounted on a single circuit board may be employed.

The wires 51, 52 are linear members shaped for example using a conductor such as a metal like copper or gold. The wires 51 include four wires laid across the magnetic sensor 30 and the signal processing IC 40, and through the four wires, drive the magnetic sensor 30 and transmit detection signals therefrom to the signal processing IC 40. The wires 52 include five wires laid across the signal processing IC 40 and the upper surfaces 21b of the plurality of device terminals 21, and through the five wires, output calculation results of the signal processing IC 40.

The package 60 is one example of a sealing member that seals in and protects the respective constituent portions of the current sensor 100 excluding part of the plurality of device terminals 21 and conductor 10. Here, the package 60 separates each of the magnetic sensor 30 and signal processing IC 40 from the conductor 10 and plurality of device terminals 21, and together with them, covers and seals therein the respective entire outer surfaces, thereby insulating the conductor 10 and the plurality of device terminals 21. The magnetic sensor 30 (assumed to include also members contacting the magnetic sensor 30 such as the signal processing IC 40 and a circuit board on which the magnetic sensor 30 and signal processing IC 40 are mounted in the case where they are mounted on the single circuit board) is covered and sealed in by the package 60 at all of its outer surfaces without contacting and being supported for example by a substrate, a film or the like arranged to contact the the conductor 10 and device terminals 21. Here, the phrase "all of its outer surfaces" refers to all of the outer surfaces excluding connecting portions of conductors such as bonding wires for connecting the magnetic sensor 30 with the signal processing IC 40, and all of its outer surfaces are covered by the package 60. In addition, if the bottom surface of the magnetic sensor 30 is provided with the insulating member 31, the front surface of the insulating member 31 is regarded as an outer surface of the magnetic sensor 30.

The package 60 is shaped into a rectangular parallelepiped having a rectangular upper surface and a thickness which is smaller than the length of one side of the upper surface, for example by mold-shaping a resin with good insulation properties such as epoxy. Because the magnetic sensor 30 and signal processing IC 40 are separated from the conductor 10 and plurality of device terminals 21 and embedded in the package 60, that is, because they are embedded singly, an interface that can spread in the package 60 from its boundary with each of the magnetic sensor 30 and signal processing IC 40 is not formed; therefore, a high withstand voltage can be obtained. In addition, because lead frames to support the magnetic sensor 30 and signal processing IC 40 become unnecessary, miniaturization of the current sensor 100 becomes possible. In addition, because it is not necessary to raise or lower the curved portion 13 surrounding the magnetic sensor 30 relative to a frame supporting the magnetic sensor 30 by performing step-formation on the conductor 10 by half-blanking or the like, increase in resistance of the conductor 10 due to the step-formation can be avoided.

The package 60 includes the first and second sealing members 61, 62 that seal in, respectively, the upper surface sides including at least the upper surfaces of and bottom surface sides including at least the bottom surfaces of the conductor 10, plurality of device terminals 21, magnetic sensor 30 and signal processing IC 40. In addition to the upper surfaces of the conductor 10, plurality of device terminals 21, magnetic sensor 30 and signal processing IC 40, their side surfaces may be assumed to be included in the upper surface sides, and in such a case, the bottom surface sides are assumed to not include the side surfaces. In addition, only the upper surfaces of the conductor 10, plurality of device terminals 21, magnetic sensor 30 and signal processing IC 40 may be assumed to be included in the upper surface sides, and in such a case, the bottom surface sides are assumed to include their side surfaces. In addition, in addition to the upper surfaces of the conductor 10, plurality of device terminals 21, magnetic sensor 30 and signal processing IC 40, part of their side surfaces may be assumed to be included in the upper surface sides, and in such a case, the bottom surface sides are assumed to include the remaining portions of the side surfaces.

As mentioned below, by supporting the bottom surfaces of the conductor 10, plurality of device terminals 21, magnetic sensor 30 and signal processing IC 40, covering their upper surface sides by the first sealing member 61, turning the conductor 10, magnetic sensor 30 and signal processing IC 40 upside down, and covering, by the second sealing member 62, their bottom surface sides excluding their upper surface sides covered by the first sealing member 61, it is possible to separate the magnetic sensor 30 and signal processing IC 40 from the conductor 10 and plurality of device terminals 21, and also to cover their entire outer surfaces to embed and seal them in the package 60 singly.

The first and second sealing members 61, 62 are formed preferably using the same material, but may be formed using mutually different materials. In addition, at least one of the first and second sealing members 61, 62 may be formed of a material containing fillers which are inorganic substance materials.

According to the current sensor 100 according to the present embodiment, by the package 60, together with the curved portion 13 of the conductor 10 through which measurement-target current flows, the magnetic sensor 30 that detects magnetic fields generated by current flowing through the conductor 10 and the signal processing IC 40 that processes output signals from the magnetic sensor 30 are separated from the conductor 10 and plurality of device terminals 21, and also their entire outer surfaces are covered and sealed in so that interfaces that can spread in the package 60, in which the magnetic sensor 30 and signal processing IC 40 are embedded, from its boundaries with the magnetic sensor 30 and the signal processing IC 40 are not formed; therefore, a high withstand voltage can be obtained.

Figure 2:
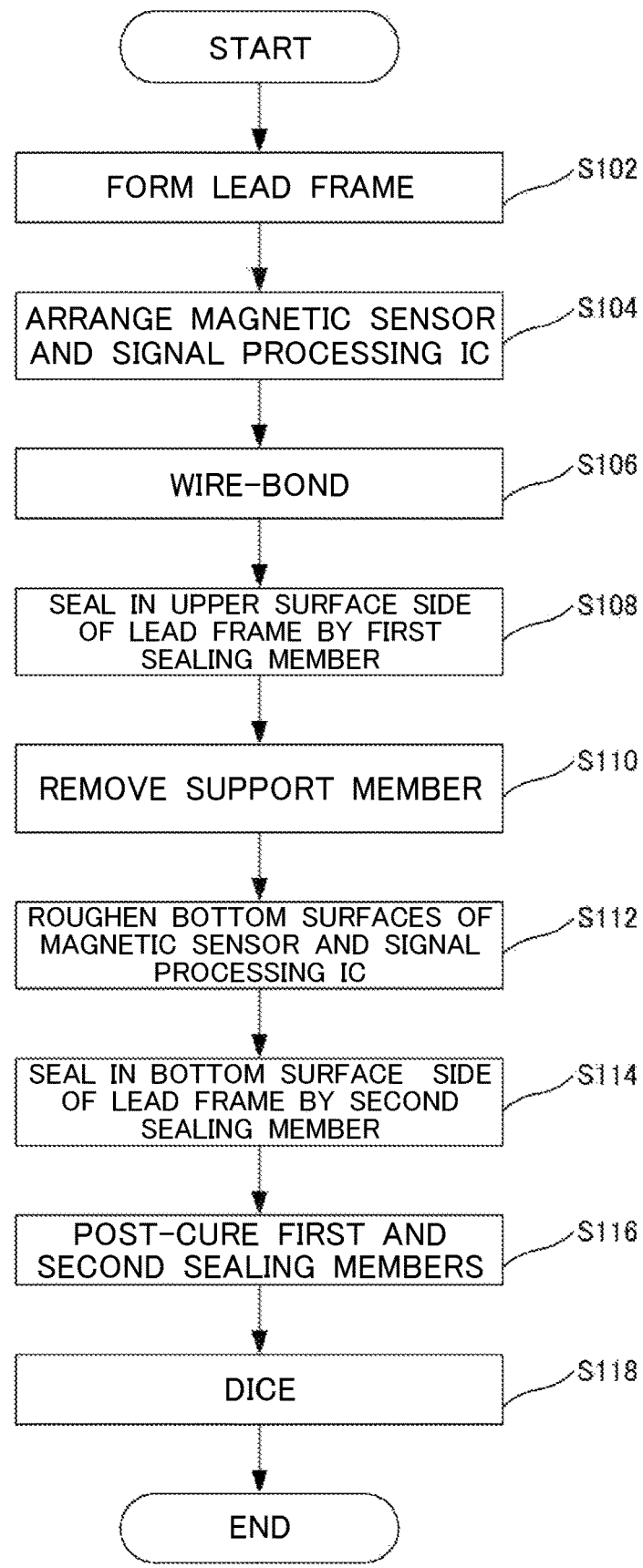
FIG. 2 shows a flow of processes to manufacture the current sensor according to the present embodiment.

A method of manufacturing the current sensor 100 according to the present embodiment is explained. FIG. 2 shows a flow of processes to manufacture the current sensor according to the present embodiment.

Figure 3A:
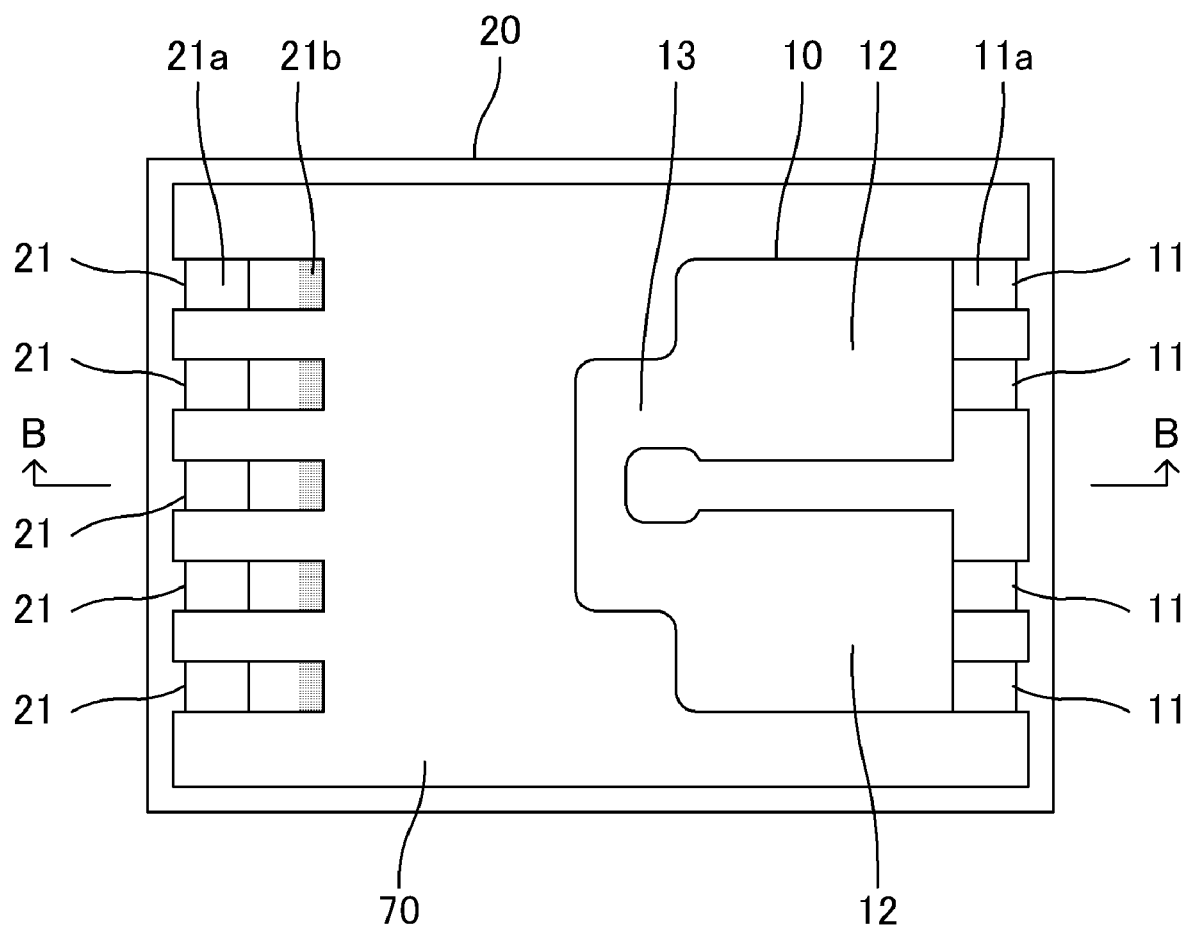
FIG. 3A shows a state of the current sensor formed through one step in the current sensor manufacturing processes, that is, the configuration of a lead frame having a bottom surface onto which a support member is pasted.
Figure 3B:
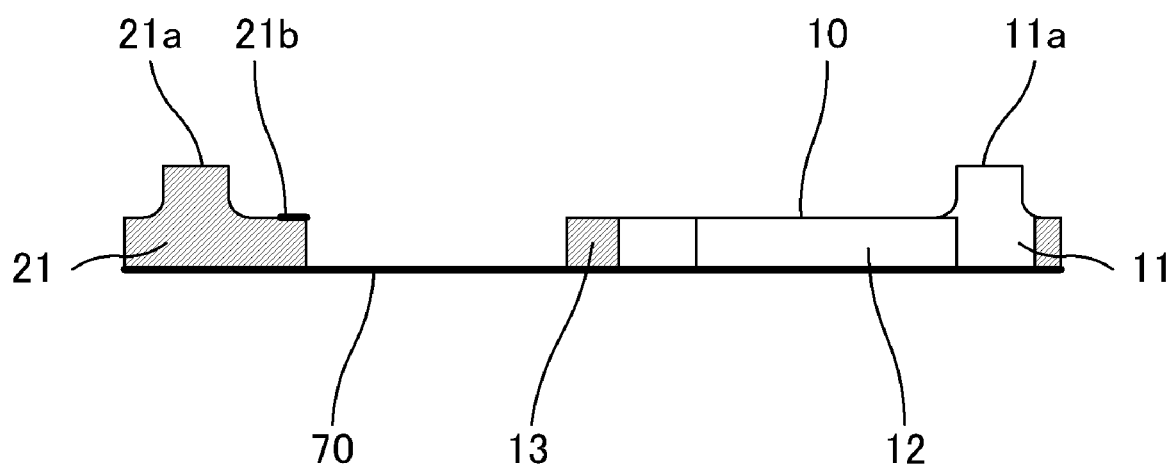
FIG. 3B shows a cross section of the current sensor taken along a reference line BB in FIG. 3A.

At Step S102, a lead frame 20 including patterns of the conductor 10 and plurality of device terminals 21 is formed. As shown in FIG. 3A and FIG. 3B, the lead frame 20 is a rectangular metal frame, and includes therein: the pattern of the conductor 10, with its two sets of terminal portions 11 being connected to the right side of the frame; and the pattern of the plurality of device terminals 21, with their left end portions being connected to the left side of the frame.

Although in the present embodiment, the single lead frame 20 includes only one set of the patterns of the conductor 10 and plurality of device terminals 21 constituting the single current sensor 100, this is one example for explanation, and the single lead frame 20 may include a plurality of sets of the patterns in which the conductor 10 and plurality of device terminals 21 are arrayed to constitute a plurality of the current sensors 100.

First, a prototype of the lead frame 20 is formed for example by pressing one metal plate. Here, the metal plate is 0.4 mm-thick, for example. Next, by etching the prototype of the lead frame 20 excluding the upper surfaces 11a at the pattern portions corresponding to the terminal portions 11 of the conductor 10 and the upper surfaces 21a at the pattern portions corresponding to the left end portions of the plurality of device terminals 21, it is shaped to be thin, for example to be 0.2 mm-thick. Thereby, the thick terminal portions 11 of the conductor 10 and the thick left end portions of the plurality of device terminals 21 function as connecting terminals. Next, a plating film is provided using for example silver on the upper surfaces of portions that are made thin by etching. Instead of this, a plating film may be provided on the entire upper surface of the lead frame 20, and after the first and second sealing members 61, 62 mentioned below are cured, the plating film on the upper surfaces 11a of the terminal portions 11 the conductor 10 and the upper surfaces 21a of the left end portions of the plurality of device terminals 21 may be removed and a new plating film may be provided for example using tin. Last, the outer edges of a sheet-like support member 70 are pasted onto the bottom surface of the lead frame 20 to provide the bottom surface to the inner side of the frame. As the support member 70, for example, a highly heat-resistant polyimide tape, ceramic sheet or the like on which an adhesive layer is formed can be employed.

Although in the method of manufacturing the current sensor 100 according to the present embodiment, the prototype of the lead frame 20 is etched to form the terminal portions 11 of the conductor 10 and the left end portions of the plurality of device terminals 21 that function as connecting terminals, instead of this, connecting terminals may be formed by bending or raising an external pattern of the lead frame 20 including the terminal portions 11 of the conductor 10 and the left end portions of the plurality of device terminals 21 relative to the internal pattern of the lead frame 20 including the leg portions 12 of the conductor 10, the curved portion 13 and the right end portions of the plurality of device terminals 21, for example by bending or half-blanking the lead frame 20. Here, if bending is performed, the lead frame 20 is for example 0.2 mm-thick, and if half-blanking is performed, the lead frame 20 is for example 0.3 mm-thick and is half-blanked by 0.12 to 0.15 mm. In addition, although a lead-less package structure is mentioned as an example, a package structure with leads in which the lead frame is bent outside the first sealing member 61 or second sealing member 62 may be employed.

Figure 4A:
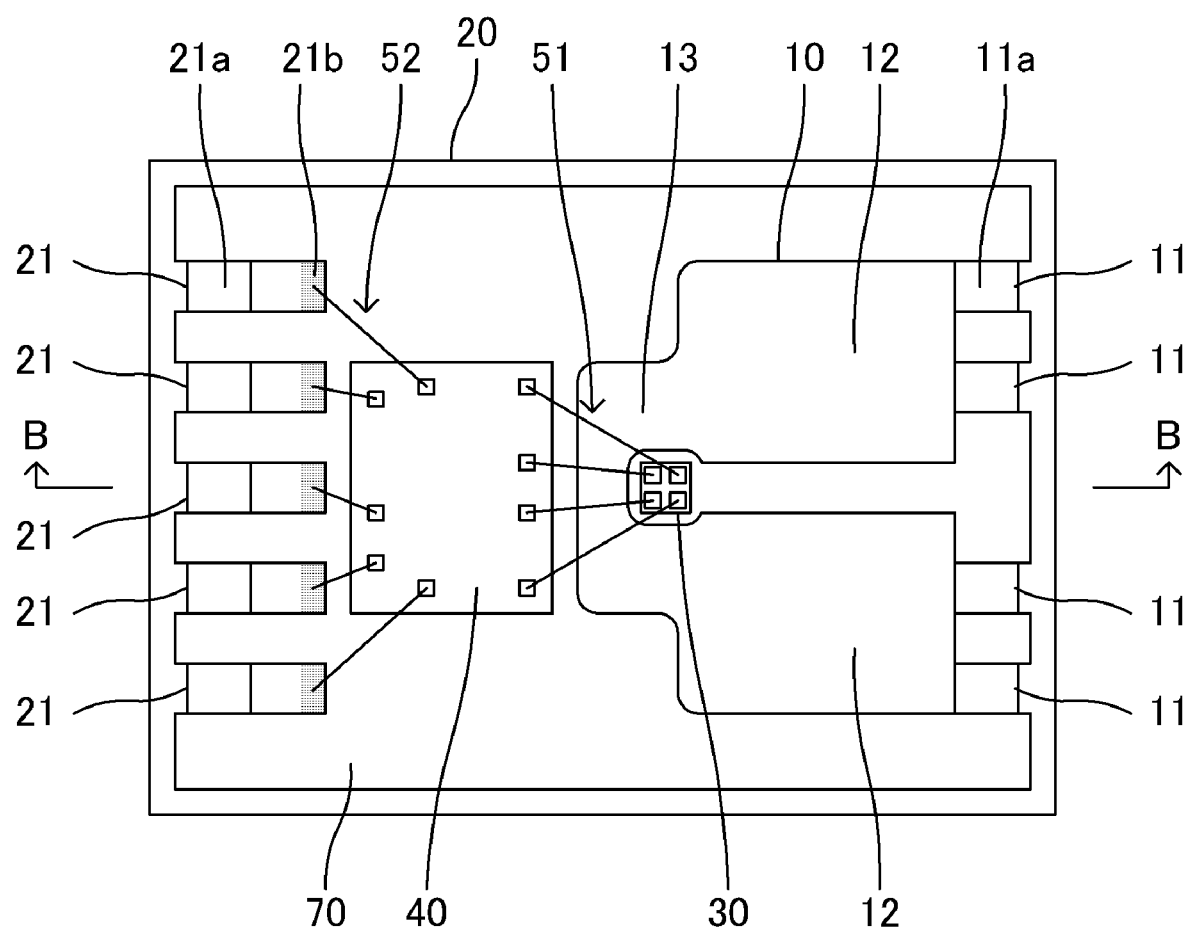
FIG. 4A shows a state of the current sensor formed through one step in the current sensor manufacturing processes, that is, a state where a magnetic sensor and a signal processing IC are arranged on a support member separately from each other and the signal processing IC is wire-bonded to the magnetic sensor and terminals.
Figure 4B:
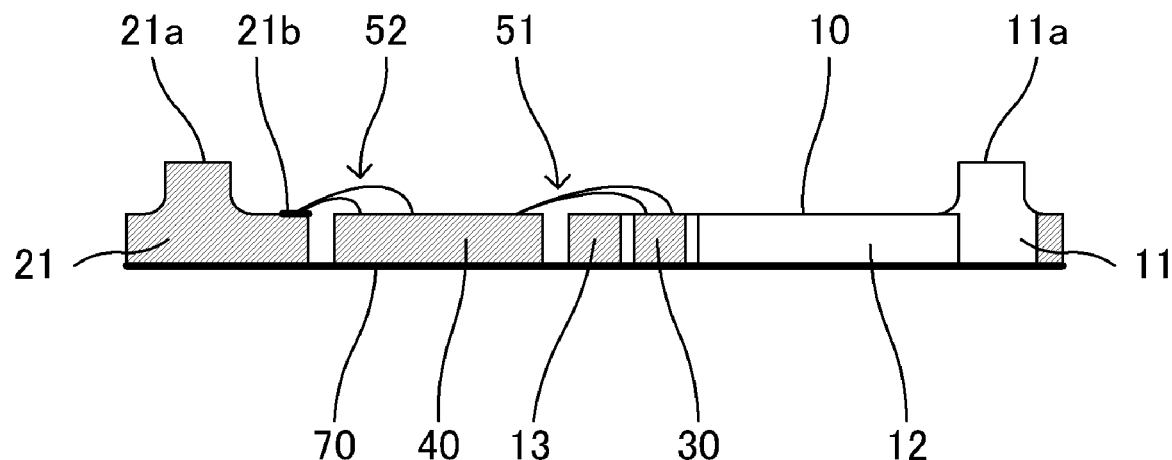
FIG. 4B shows a cross section of the current sensor taken along a reference line BB in FIG. 4A.

At Step S104, the magnetic sensor 30 and signal processing IC 40 are installed inside the lead frame 20 separately from the lead frame 20. As shown in FIG. 4A and FIG. 4B, on the support member 70 provided as the bottom surface of the lead frame 20, the magnetic sensor 30 is arranged, in the plan view, on the inner side of the curved portion 13 of the conductor 10, preferably at the center of curvature of a current path in the curved portion 13 separately from the curved portion 13, and the signal processing IC 40 is arranged, in the plan view, between the curved portion 13 of the conductor 10 and the plurality of device terminals 21 separately from each of them. The magnetic sensor 30 and signal processing IC 40 are stuck by an adhesive layer formed on the front surface of the support member 70.

At Step S106, as shown in FIG. 4A and FIG. 4B, the magnetic sensor 30 and the signal processing IC 40 are wire-bonded by the wires 51, and the signal processing IC 40 and the plurality of device terminals 21 are wire-bonded by the wires 52.

Figure 5A:
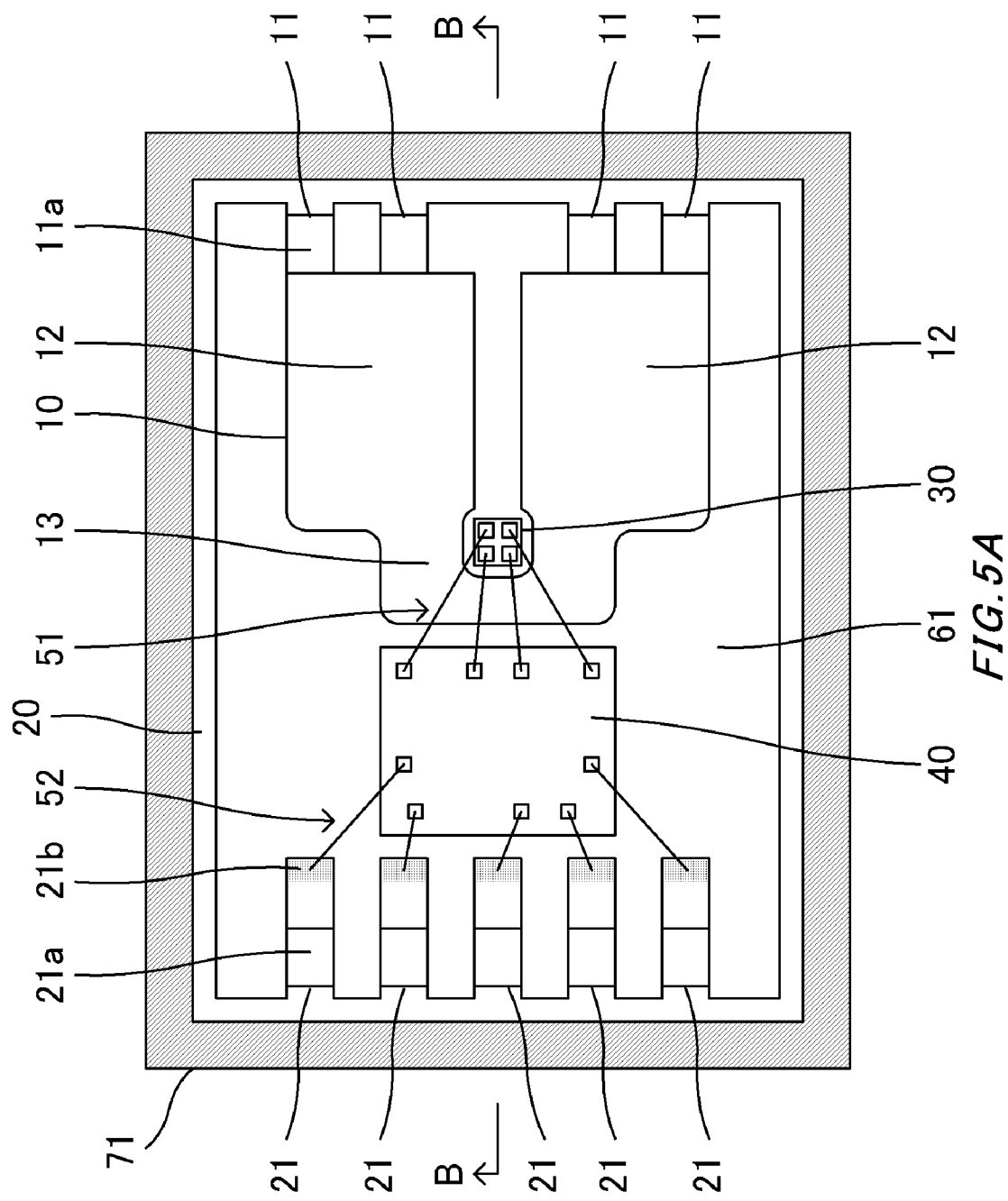
FIG. 5A shows a state of the current sensor formed through one step in the current sensor manufacturing processes, that is, a state where the upper surface sides of the lead frame, magnetic sensor and signal processing IC are sealed in by a first sealing member, the figure showing a cross section taken along a reference line AA in FIG. 5B.
Figure 5B:
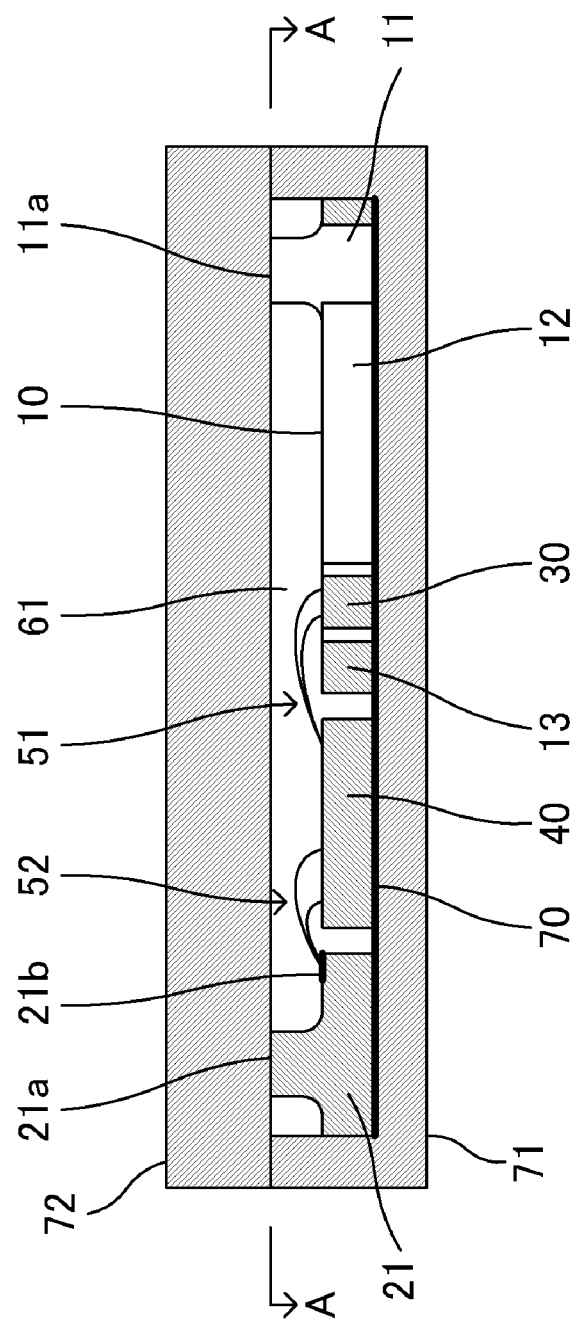
FIG. 5B shows a cross section of the current sensor taken along a reference line BB in FIG. 5A.

At Step S108, the upper surface sides including at least the upper surfaces of the lead frame 20, magnetic sensor 30 and signal processing IC 40 (in the present example, the side surfaces are included in addition to the upper surfaces, but only the upper surfaces may be included, or part of the side surfaces may be included in addition to the upper surfaces) are sealed in by the first sealing member 61. As shown in FIG. 5A and FIG. 5B, the lead frame 20 in which the magnetic sensor 30 and signal processing IC 40 are arranged on the support member 70 is housed in a box-shaped mold 71 with an open upper surface, a tabular lid 72 is pressed against the mold 71 to close the inner space of the mold 71 including the lead frame 20, and a sealing member is poured into the mold 71 through a through hole (not illustrated) of the mold 71. Here, as the first sealing member 61, resin such as epoxy which is an insulative material can be employed. In addition, as the first sealing member 61, resin including fillers may be employed. Furthermore, in order to prevent resin-bleed onto the upper surfaces 11a of the terminal portions 11 of the conductor 10 and the upper surfaces 21a of the device terminals 21, a surface of the lid 72 on the mold 71 side may be covered by a resin film (for example, a Teflon (registered trademark) film).

At Step S110, the support member 70 is removed from the lead frame 20. The lead frame 20 the upper surface side of which is sealed in by the first sealing member 61 is taken out of the mold 71, and turned upside down, and the support member 70 is peeled off from the bottom surface of the lead frame 20.

At Step S112, the respective bottom surfaces of (the portions of the conductor 10 and the plurality of device terminals 21 of) the lead frame 20 from which the support member 70 is removed, the magnetic sensor 30, the signal processing IC 40 and the first sealing member 61 are roughened. Here, as a method of roughening, for example, wet-blasting or plasma treatment can be employed. In wet-blasting, fine particles are mixed in water and sprayed onto the front surfaces so that: the fine particles impinge thereon and scrape off the outermost layers of the front surfaces; foreign bodies also are washed away by water; and the front surfaces are treated on the order of, for example, submicron. In plasma treatment, the front surfaces are irradiated with plasma to treat the front surfaces. The arithmetic mean roughness (Ra) of the respective bottom surfaces of the lead frame 20 (the conductor 10 and plurality of device terminals 21), magnetic sensor 30 and signal processing IC 40 are made equal to or higher than 0.01 μm. Thereby, the second sealing member 62 that seals in the bottom surface side of the lead frame 20 closely contacts the respective bottom surfaces of the conductor 10, magnetic sensor 30, signal processing IC 40 and first sealing member 61.

The lead frame 20, magnetic sensor 30 and signal processing IC 40 may be roughened in advance, and Step S112 may be omitted. In such a case, the lead frame 20 in which at least the portions of the conductor 10 and plurality of device terminals 21 are roughened-plated may be used.

If the bottom surfaces of the conductor 10, magnetic sensor 30, signal processing IC 40 and first sealing member 61 are not roughened but the second sealing member 62 sufficiently closely contacts them, Step S112 may be omitted. In addition, the bottom surfaces of the lead frame 20, magnetic sensor 30 and signal processing IC 40 may be roughened in advance, and Step S112 may be omitted.

Figure 6A:
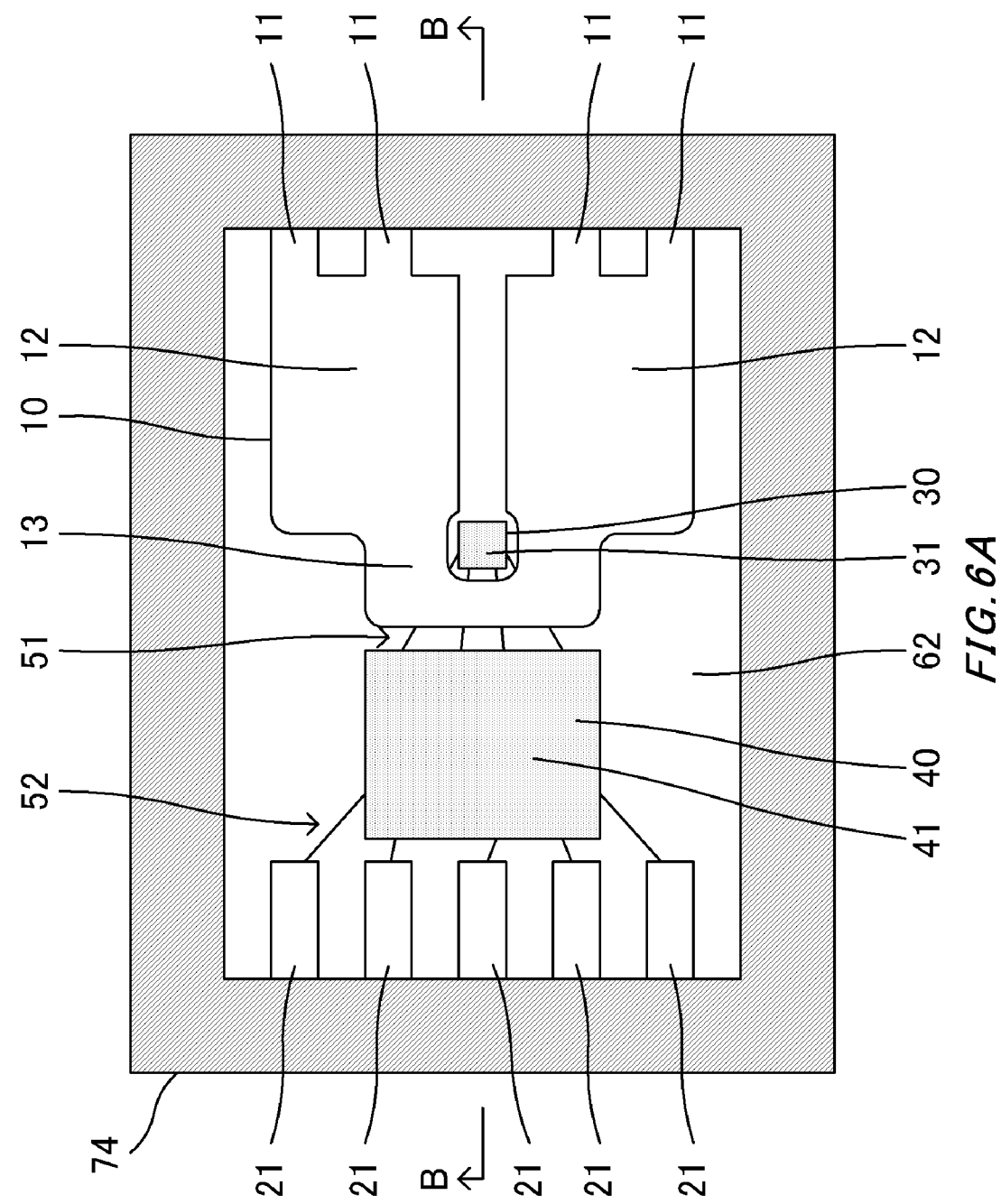
FIG. 6A shows a state of the current sensor formed through one step in the current sensor manufacturing processes, that is, a state where the bottom surface sides of the lead frame, magnetic sensor and signal processing IC, from which the support member is removed, are sealed in by a second sealing member, the figure showing a cross section taken along a reference line AA in FIG. 6B.
Figure 6B:
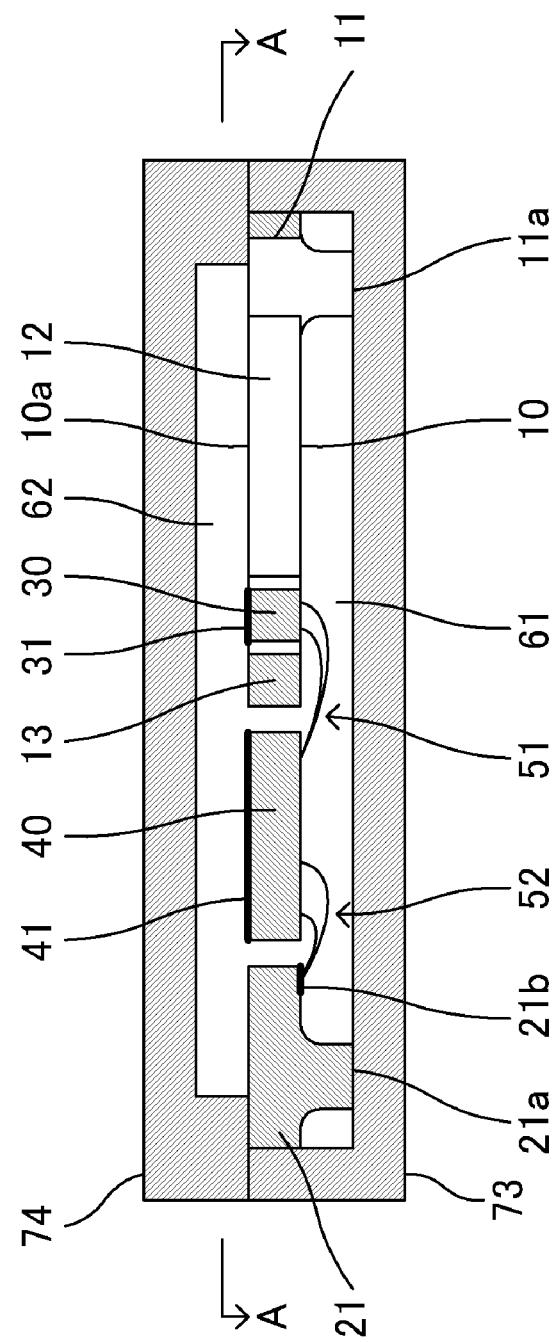
FIG. 6B shows a cross section of the current sensor taken along a reference line BB in FIG. 6A.

At Step S114, the bottom surface sides including at least the bottom surfaces of the lead frame 20, magnetic sensor 30 and signal processing IC 40 (in the present example, only the bottom surfaces are included, but if the upper surface sides including only the upper surfaces or including part of the side surfaces in addition to the upper surfaces are sealed in by the first sealing member 61 at Step S108, the side surfaces or the remaining portions of the side surfaces are included in addition to the bottom surfaces) are sealed in by the second sealing member 62. Before performing post-curing of the first sealing member 61 shaped at Step S108, as shown in FIG. 6A and FIG. 6B, the lead frame 20 having a roughened bottom surface which has been turned upside down is housed in a box-shaped mold 73 with an open upper surface, a box-shaped mold 74 with an open bottom surface is pressed against the mold 73 to close the inner space of the mold 74 with the bottom surface of the lead frame 20, and the second sealing member 62 is poured into the mold 74 through a through hole (not illustrated) of the mold 74. Here, as the second sealing member 62, resin such as epoxy which is an insulative material like the first sealing member is employed. In addition, as the second sealing member 62, resin including fillers may be employed. Thereby, while the temperature of the resin of the first sealing member 61 is above its glass transition point and the resin is softened, the respective bottom surfaces of the conductor 10 and plurality of device terminals 21 included in the lead frame 20, the magnetic sensor 30 and the signal processing IC 40 are covered by the second sealing member 62, and epoxy resin components at the boundary portion of the second sealing member 62 not covering the bottom surfaces of the conductor 10 and the like and epoxy resin components at the boundary portion of the first sealing member 61 are integrated and cured. With fabrication through such a procedure, if a cross section is observed later on, a feature can be observed that fillers which are among fillers, inorganic substance materials contained in the second sealing member 62, and which have sizes equal to or higher than 20 μm particularly are not present crossing the boundary portion between the first sealing member 61 and the second sealing member 62. Because interfaces which can spread in the integrated first and second sealing members 61, 62 from their boundaries with the conductor 10, plurality of device terminals 21, magnetic sensor 30 or signal processing IC 40 are not formed, a high withstand voltage can be obtained.

At Step S116, post-curing of the first and second sealing members 61, 62 is performed. Thereby, the boundary portions of the first and second sealing members 61, 62 are integrated by the first and second sealing members 61, 62 and post-cured so that the package 60 is formed at a reduced rate of uncured portions. The package 60 seals therein the magnetic sensor 30 and signal processing IC 40 separately from the conductor 10 and plurality of device terminals 21 included in the lead frame 20, while the frames of the lead frame 20 and the portions linking the frames with the terminal portions 11 of the conductor 10 and the plurality of device terminals 21 are left unsealed in.

It is effective to simultaneously post-cure the first and second sealing members 61, 62 after formation of both of them as mentioned above in that the boundary portions of the first and second sealing members 61, 62 are integrated and an interface is not formed therebetween; however, if an interface is not formed or if the degree of formation thereof is negligible, the first sealing member 61 may be post-cured, and then the second sealing member 62 may be post-cured.

Figure 7A:
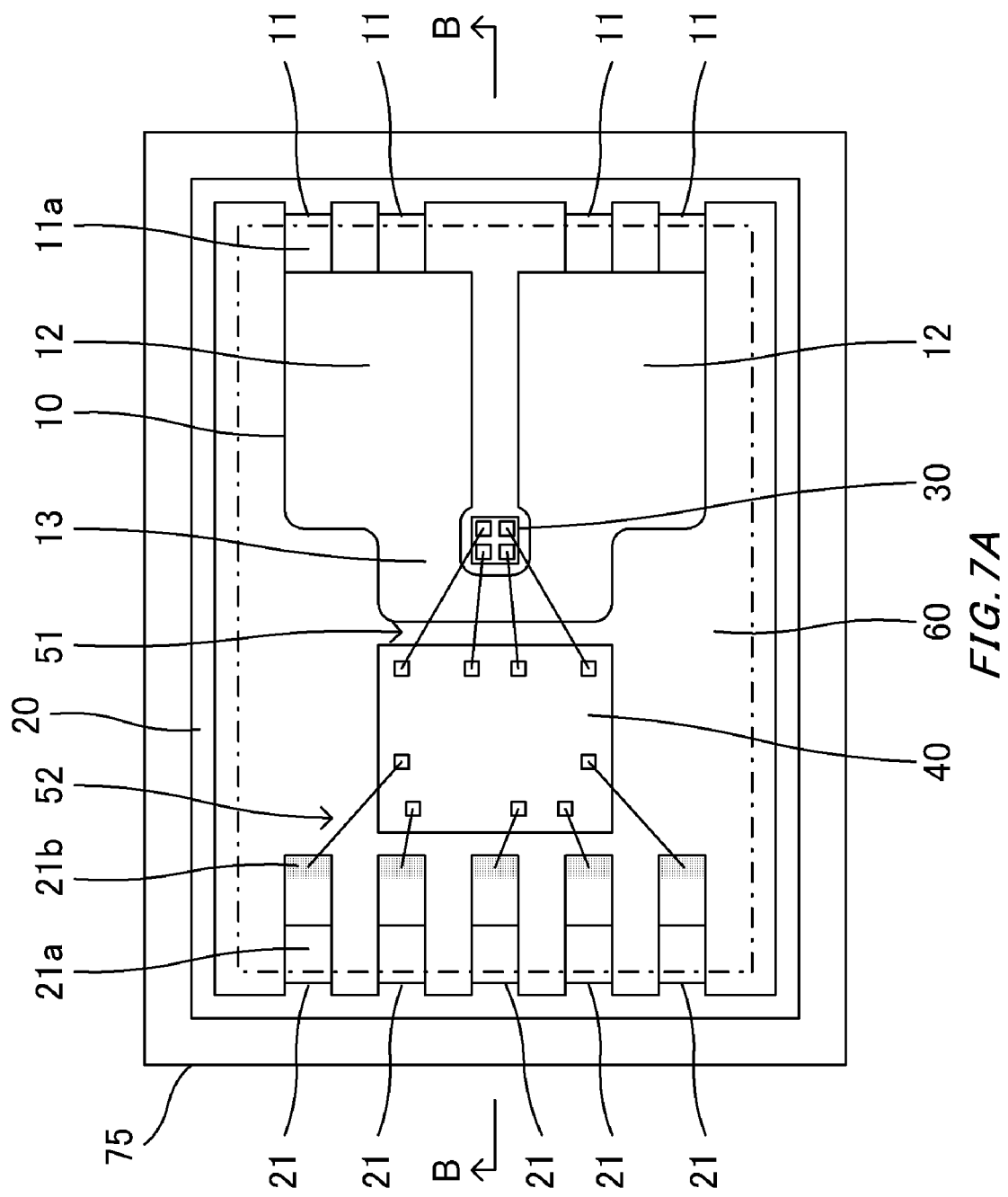
FIG. 7A shows a state of the current sensor formed through one step in the current sensor manufacturing processes, that is, a state where the lead frame, magnetic sensor and signal processing IC are packaged by the sealing members.
Figure 7B:
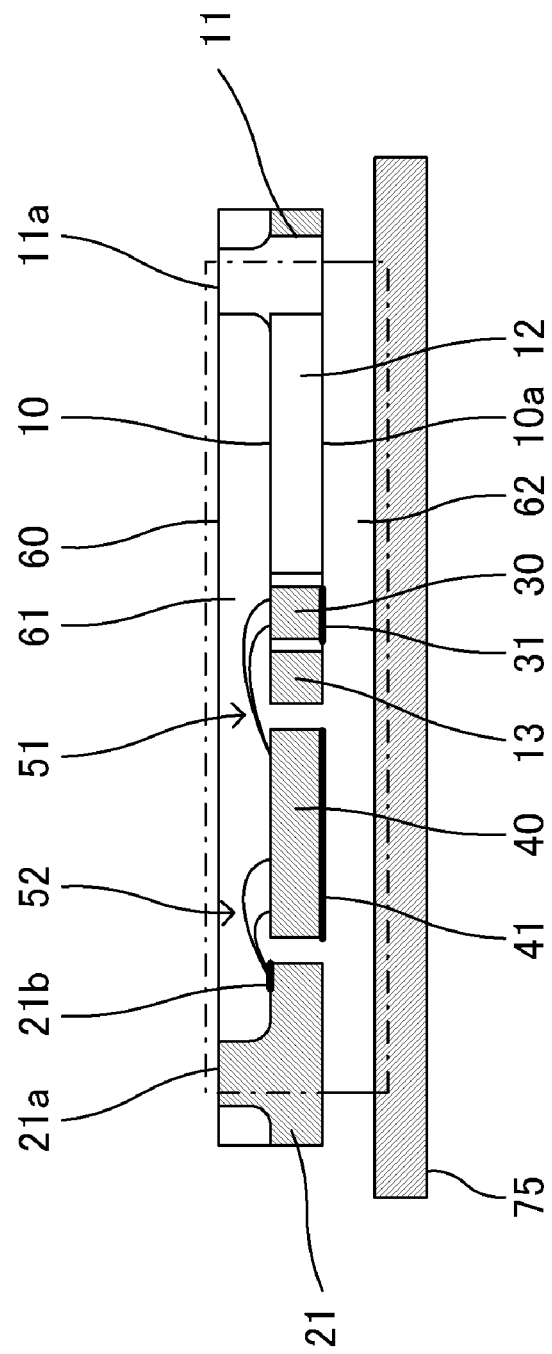
FIG. 7B shows a cross section of the current sensor taken along a reference line BB in FIG. 7A.

At Step S118, the package 60 is diced. As shown in FIG. 7A and FIG. 7B, the package 60 is turned upside down and is pasted onto a dicing tape 75, and patterns exposed out of the package 60, that is, the portions linking the frames of the lead frame 20 with the terminal portions 11 of the conductor 10 and the plurality of device terminals 21 are cut off together with the outer edge of the first sealing member 61. Thereby, the upper surfaces 11a of the terminal portions 11 of the conductor 10 and the upper surfaces 21a of the plurality of device terminals 21 are exposed flush at the upper surface of the package 60 to form connecting terminals, thereby completing the current sensor 100.

According to the method of manufacturing the current sensor 100 according to the present embodiment: the lead frame 20 including the conductor 10 and plurality of device terminals 21, the magnetic sensor 30 and the signal processing IC 40 are arranged separately from each other on the support member 70; the upper surface sides including at least their respective upper surfaces are sealed in by the first sealing member 61; and after the support member 70 is removed, the bottom surface sides including their respective bottom surfaces other than their upper surface sides are sealed in by the second sealing member 62. Thereby, the package 60 formed of the integrated first and second sealing members 61, 62 separates from each other the curved portion 13 of the conductor 10 through which measurement-target current flows, the magnetic sensor 30 that detects magnetic fields generated by current flowing through the conductor 10 and the signal processing IC 40 that processes output signals from the magnetic sensor 30 and also covers and seals in their respective entire outer surfaces, and interfaces that can spread in the package 60, in which the magnetic sensor 30 and signal processing IC 40 are embedded, from its boundaries with them are not formed; therefore, a high withstand voltage can be obtained.

Although in the current sensor 100 according to the present embodiment, the package 60 is shaped as a lead-less package not having leads at the terminal portions 11 of the conductor 10 and the plurality of device terminals 21, instead of this, it may be shaped as a package with leads.

In the current sensor 100 according to the present embodiment, current flowing through the conductor 10 may be direct current or alternating current. In addition, in the case of direct current, the direction of current to flow may be defined in any manner.

Although in the method of manufacturing the current sensor 100 according to the present embodiment, the package 60 is formed through resin mold-shaping using the molds 71 to 74, instead of this, a package may be formed using a 3D printer.

In the current sensor 100 according to the present embodiment, the current sensor 100 may be used as a magnetic detection device that detects external magnetic fields and measures their strengths, without causing current to flow through the conductor 10. In such a case, the conductor 10 may not be provided in the package 60 as in a variant mentioned below.

Figure 8A:
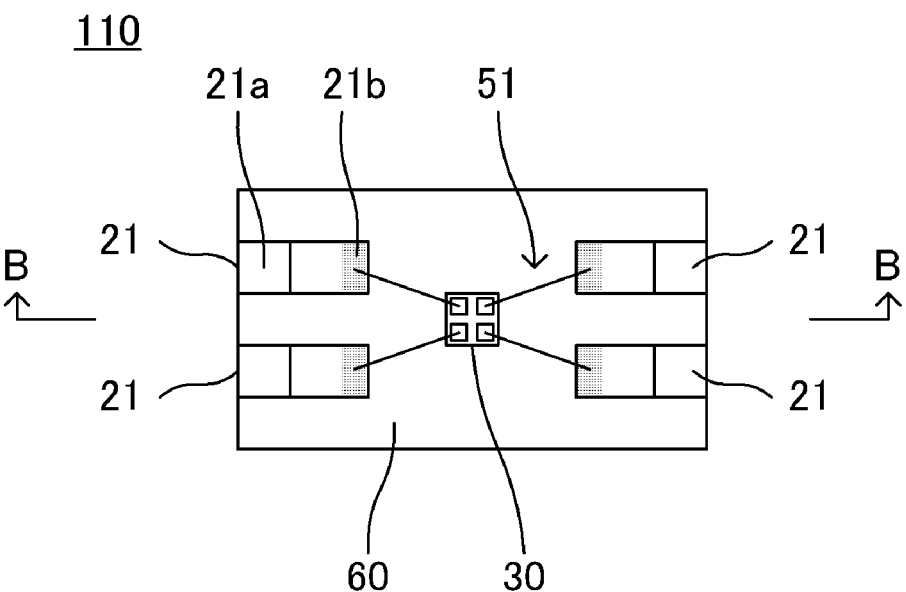
FIG. 8A shows the internal configuration of a Hall sensor according to a variant.
Figure 8B:
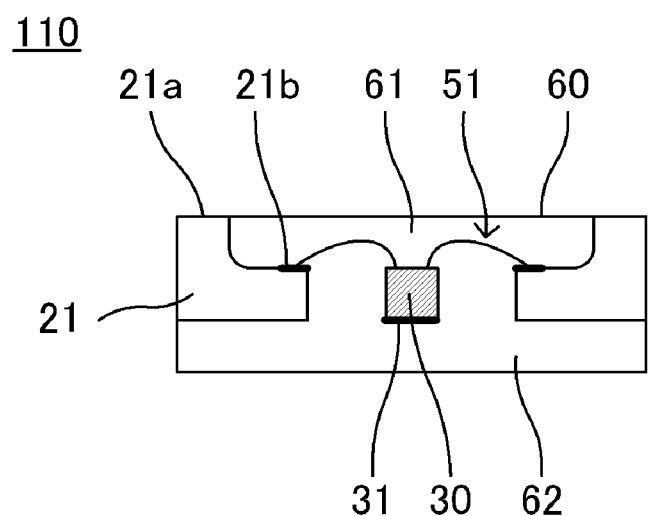
FIG. 8B shows the configuration of the Hall sensor as seen in a cross section taken along a reference line BB in FIG. 8A.

FIG. 8A and FIG. 8B show the configuration of a Hall sensor 110 according to a variant. Here, FIG. 8A shows the internal configuration of the Hall sensor 110 in the plan view, and FIG. 8B shows the configuration of the Hall sensor 110 as seen in a cross section taken along a reference line BB in FIG. 8A. The Hall sensor 110 is one example of a magnetic detection device that detects external magnetic fields and measures their strengths, and includes the magnetic sensor 30, the plurality of device terminals 21, the wires 51 and the package 60. These respective constituent portions may be configured similarly to those provided to the above-mentioned current sensor 100, so they are indicated with the same reference symbols in the figures, and detailed explanation thereof is omitted.

The magnetic sensor 30 is one example of a magnetic detection element that detects magnetic fields entering the Hall sensor 110 (that is, external magnetic fields). The magnetic sensor 30 is arranged at a middle portion of the Hall sensor 110. The magnetic sensor 30 is connected to the plurality of device terminals 21 by wire-bonding, and outputs, for example to a signal processing IC connected to the Hall sensor 110 via the plurality of device terminals 21, a voltage corresponding to the strengths of the detected magnetic fields as an output signal.

The plurality of device terminals 21 output the output signal of the magnetic sensor 30 to an external device. The plurality of device terminals 21 include four terminals as one example, and are arranged at predetermined positions on both sides, in the lateral direction, of the magnetic sensor 30, with each couple of terminals being separated in the longitudinal direction.

The wires 51 include four wires laid across the magnetic sensor 30 and the upper surfaces 21b of the plurality of device terminals 21, and through the four wires, outputs detection signals of the magnetic sensor 30.

The package 60 seals in and protects the respective constituent portions of the Hall sensor 110 excluding part of the plurality of device terminals 21. The package 60 separates the magnetic sensor 30 from the plurality of device terminals 21, and together with them, covers and seals therein its entire outer surface, thereby insulating it from each among the plurality of device terminals 21. In other words, the entire outer surface of the magnetic sensor 30 is covered and sealed in by the package 60 without contacting and being supported for example by a substrate, a film or the like arranged to contact the device terminals 21. Because the magnetic sensor 30 is embedded in the package 60 separately from the plurality of device terminals 21, that is, because they are embedded singly, an interface that can spread in the package 60 from its boundary with the magnetic sensor 30 is not formed, so a high withstand voltage can be obtained. In addition, because a lead frame to support the magnetic sensor 30 becomes unnecessary, miniaturization of the Hall sensor 110 becomes possible.

The package 60 includes the first and second sealing members 61, 62 that seal in, respectively, the upper surface sides including at least the upper surfaces of and bottom surface sides including at least the bottom surfaces of the plurality of device terminals 21 and magnetic sensor 30. Similarly to the above-mentioned current sensor 100, by supporting the bottom surfaces of the plurality of device terminals 21 and magnetic sensor 30, covering their upper surface sides by the first sealing member 61, turning the magnetic sensor 30 upside down, and covering their bottom surface sides by the second sealing member 62, it is possible to separate the magnetic sensor 30 from the plurality of device terminals 21, and also to cover their entire outer surfaces to embed and seal them in the package 60 singly. Although the first and second sealing members 61, 62 are formed preferably using the same material, but may be formed using mutually different materials.

Figure 9A:
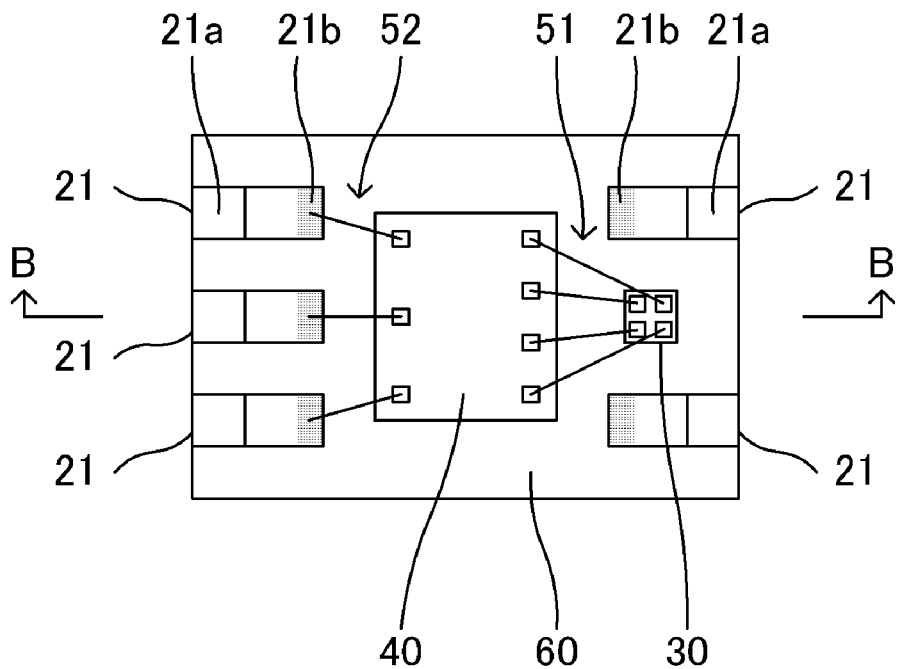
FIG. 9A shows the internal configuration of a Hall IC according to a variant.
Figure 9B:
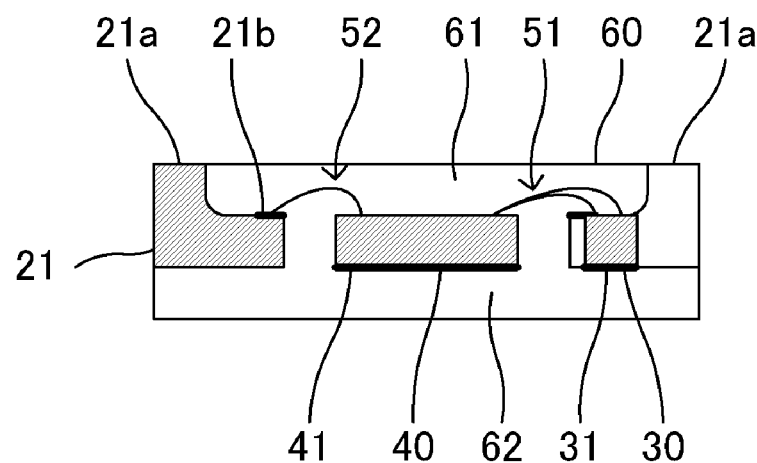
FIG. 9B shows the configuration of the Hall IC as seen in a cross section taken along a reference line BB in FIG. 9A.

FIG. 9A and FIG. 9B show the configuration of a Hall IC 111 according to a variant. Here, FIG. 9A shows the internal configuration of the Hall IC 111 in the plan view, and FIG. 9B shows the configuration of the Hall IC 111 as seen in a cross section taken along a reference line BB in FIG. 9A. The Hall IC 111 is one example of a magnetic detection device that detects external magnetic fields and measures their strengths, and includes the plurality of device terminals 21, the magnetic sensor 30, the signal processing IC 40, the wires 51, 52 and the package 60. These respective constituent portions may be configured similarly to those provided to the above-mentioned current sensor 100, so they are indicated with the same reference symbols in the figures, and detailed explanation thereof is omitted.

The magnetic sensor 30 is one example of a magnetic detection element that detects magnetic fields entering the Hall IC 111 (that is, external magnetic fields). The magnetic sensor 30 is arranged on the right side of a middle portion of the Hall IC 111.

The magnetic sensor 30 is connected to the signal processing IC 40 by wire-bonding, and outputs, to the signal processing IC 40, a voltage corresponding to the strengths of detected magnetic fields as an output signal.

The signal processing IC 40 processes signals output by the magnetic sensor 30 and calculates the strengths of magnetic fields entering the Hall IC 111. In the variant, a device configured hybridly as a device separate from the magnetic sensor 30 is employed as the signal processing IC 40. The signal processing IC 40 is arranged at a middle portion of the Hall IC 111 and adjacent to the magnetic sensor 30.

The signal processing IC 40 is connected to the plurality of device terminals 21 by wire-bonding, and through the plurality of device terminals 21, outputs magnetic field strength calculation results and further receives input of parameter setting and the like. Any of the plurality of device terminals 21 may be used as a ground terminal.

Although in the Hall IC 111 according to the variant, the signal processing IC 40 configured hybridly as a device separate from the magnetic sensor 30 is employed, instead of this, a signal processing IC including a signal processing circuit formed on a semiconductor substrate on which the magnetic sensor 30 is formed as well, that is, a signal processing IC configured monolithically together with the magnetic sensor 30 may be employed. In addition, a hybrid signal processing IC in which the magnetic sensor 30 and signal processing IC 40 are mounted on a single circuit board may be employed.

The plurality of device terminals 21 are terminals through which magnetic field strength calculation results output from the signal processing IC 40 are output to an external device and through which signals for setting correction parameters are input from an external device to the signal processing IC 40. The plurality of device terminals 21 include five terminals as one example, and are respectively arranged at predetermined positions such that on the laterally left side, three terminals are separated in the longitudinal direction and on the laterally right side, two terminals are separated from each other in the longitudinal direction sandwiching the magnetic sensor 30 therebetween.

The wires 51 include four wires laid across the magnetic sensor 30 and the signal processing IC 40, and through the four wires, drive the magnetic sensor 30 and transmit detection signals therefrom to the signal processing IC 40. The wires 52 include three wires laid across the signal processing IC 40 and the upper surfaces 21b of the plurality of device terminals 21, and through the three wires, output calculation results of the signal processing IC 40.

The package 60 seals in and protects the respective constituent portions of the Hall IC 111 excluding part of the plurality of device terminals 21. The package 60 separates each of the magnetic sensor 30 and signal processing IC 40 from the plurality of device terminals 21, and together with them, covers and seals therein the respective entire outer surfaces, thereby insulating them from each among the plurality of device terminals 21. In other words, the magnetic sensor 30 (assumed to include members contacting the magnetic sensor 30 such as the signal processing IC 40 and a circuit board on which the magnetic sensor 30 and signal processing IC 40 are mounted in the case where they are mounted on the single circuit board) is covered and sealed in by the package 60 at the entire outer surface without contacting and being supported for example by a substrate, a film or the like arranged to contact the device terminals 21. Because the magnetic sensor 30 is embedded in the package 60 separately from the plurality of device terminals 21, that is, because they are embedded singly, an interface that can spread in the package 60 from its boundary with the magnetic sensor 30 is not formed, so a high withstand voltage can be obtained. In addition, because a lead frame to support the magnetic sensor 30 becomes unnecessary, miniaturization of the Hall IC 111 becomes possible.

The package 60 includes the first and second sealing members 61, 62 that seal in, respectively, the upper surface sides including at least the upper surfaces of and bottom surface sides including at least the bottom surfaces of the plurality of device terminals 21, magnetic sensor 30 and signal processing IC 40. By supporting the bottom surfaces of the plurality of device terminals 21, magnetic sensor 30 and signal processing IC 40, covering their upper surface sides by the first sealing member 61, turning the magnetic sensor 30 and signal processing IC 40 upside down, and covering, by the second sealing member 62, their bottom surface sides, it is possible to separate the magnetic sensor 30 and signal processing IC 40 from the plurality of device terminals 21, and also to cover their entire outer surfaces to embed and seal them in the package 60 singly. The first and second sealing members 61, 62 are formed preferably using the same material, but may be formed using mutually different materials.

Figure 10:
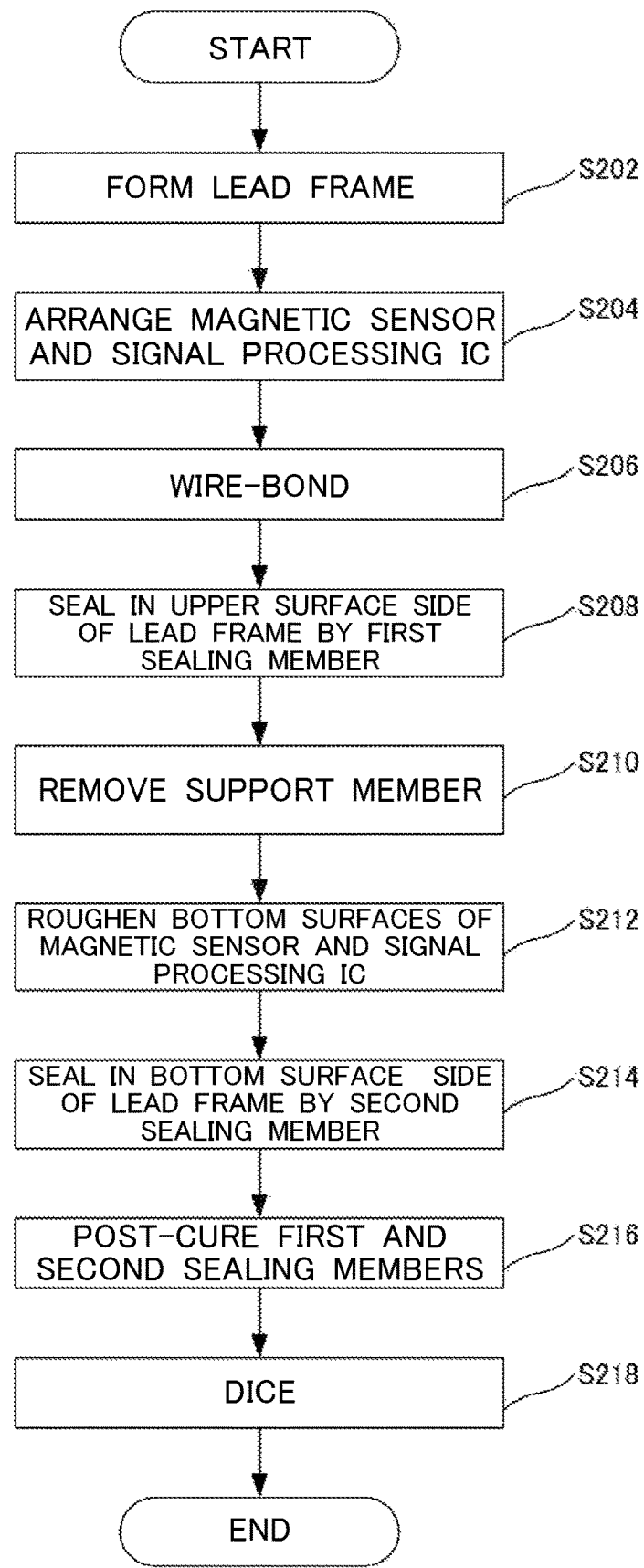
FIG. 10 shows a flow of processes to manufacture the Hall IC according to the variant.

A method of manufacturing the Hall IC 111 according to the variant is explained. FIG. 10 shows a flow of processes to manufacture the Hall IC 111 according to the variant.

Figure 11A:
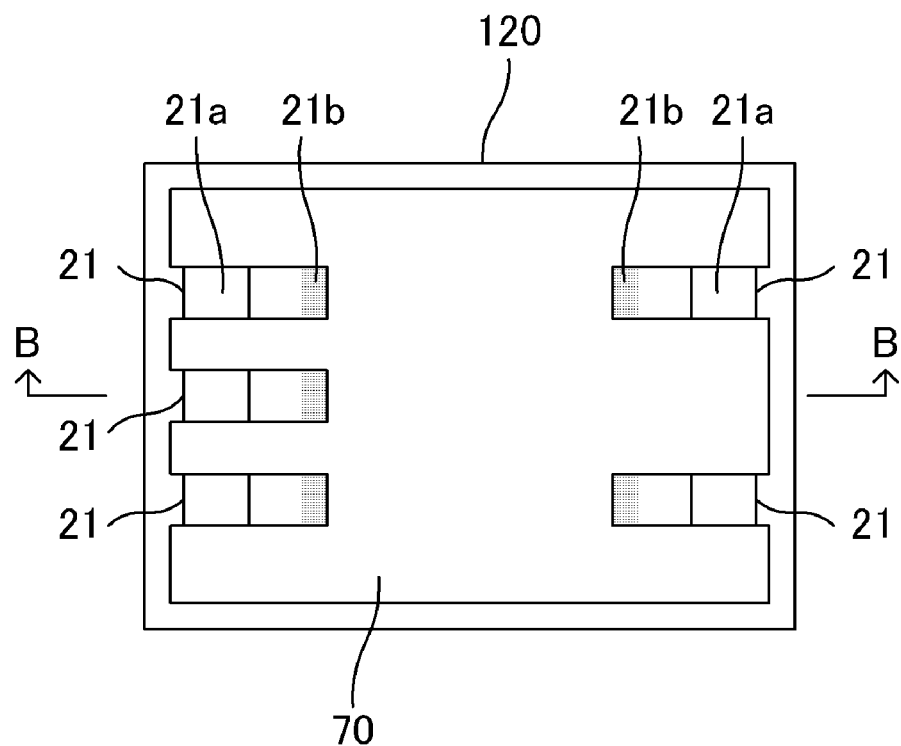
FIG. 11A shows a state of the Hall IC formed through one step in the Hall IC manufacturing processes, that is, the configuration of a lead frame having a bottom surface onto which a support member is pasted.
Figure 11B:
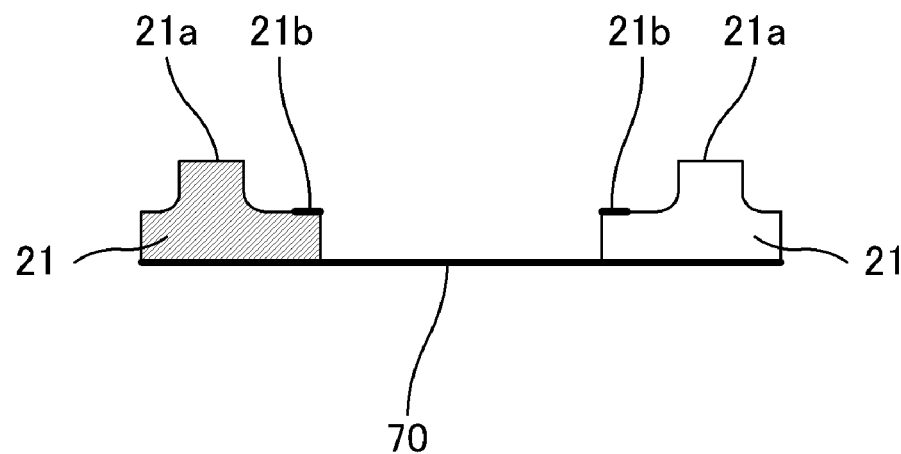
FIG. 11B shows a cross section of the Hall IC taken along a reference line BB in FIG. 11A.

At Step S202, a lead frame 120 including patterns of the plurality of device terminals 21 is formed. As shown in FIG. 11A and FIG. 11B, the lead frame 120 is a rectangular metal frame, includes therein: patterns of three among the plurality of device terminals 21, with their left end portions being connected to the left side of the frame, and the two patterns, with their right end portions being connected to the right side of the frame, and includes, as its bottom surface, the sheet-like support member 70 with its outer edge being pasted onto the bottom surface of the lead frame 120. The method of manufacturing the lead frame 120 is the same as the above-mentioned lead frame 20.

Figure 12A:
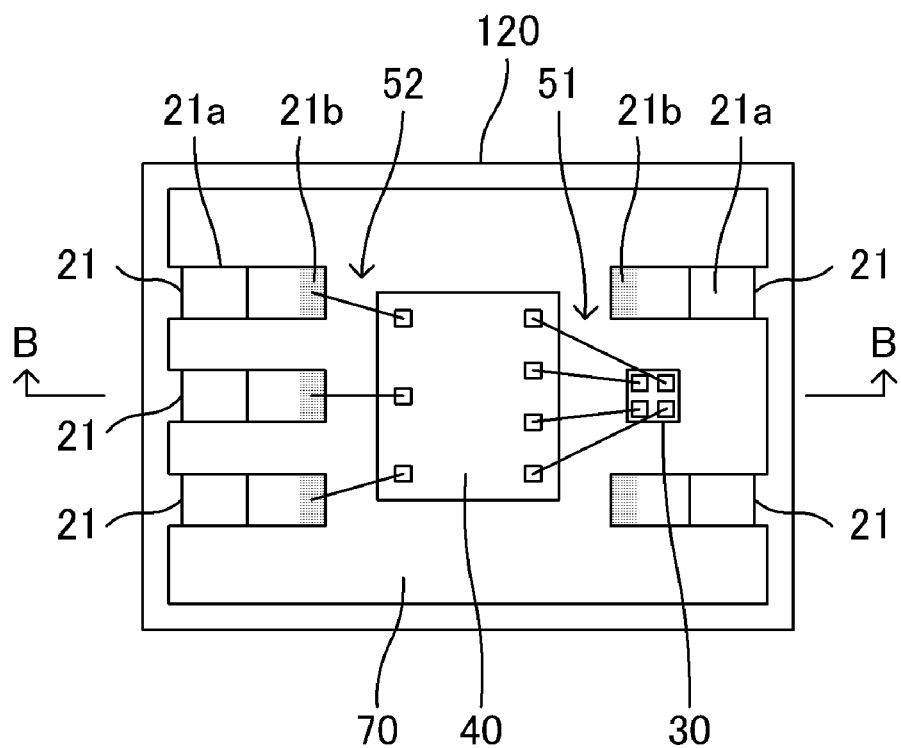
FIG. 12A shows a state of the Hall IC formed through one step in the Hall IC manufacturing processes, that is, a state where a magnetic sensor and a signal processing IC are arranged on a support member separately from each other and the signal processing IC is wire-bonded to the magnetic sensor and terminals.
Figure 12B:
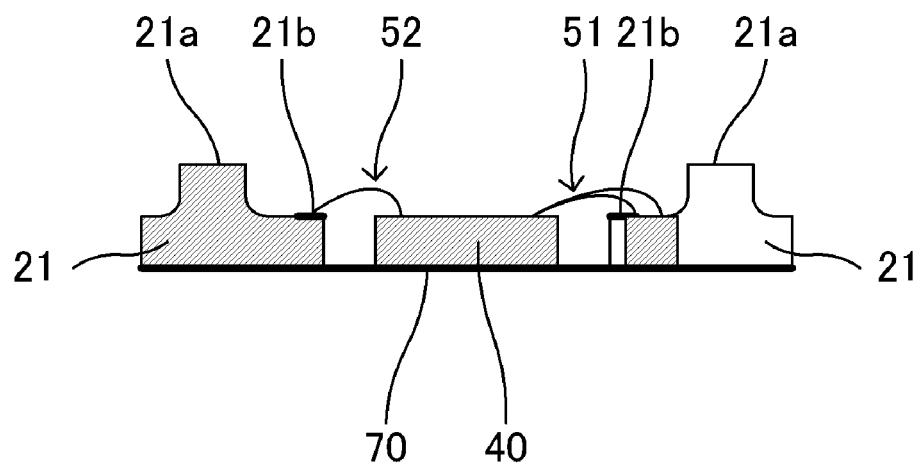
FIG. 12B shows a cross section of the Hall IC taken along a reference line BB in FIG. 12A.

At Step S204, the magnetic sensor 30 and signal processing IC 40 are installed inside the lead frame 120 separately from the lead frame 120. As shown in FIG. 12A and FIG. 12B, on the support member 70 provided as the bottom surface of the lead frame 120, the magnetic sensor 30 is arranged on the right side of a middle portion of the lead frame 120 in the plan view, the signal processing IC 40 is arranged at a middle portion of the lead frame 120 in the plan view, and both the magnetic sensor 30 and the signal processing IC 40 are arranged separately from the plurality of device terminals 21. The magnetic sensor 30 and signal processing IC 40 are stuck by an adhesive layer formed on the front surface of the support member 70.

At Step S206, as shown in FIG. 12A and FIG. 12B, the magnetic sensor 30 and the signal processing IC 40 are wire-bonded by the wires 51, and the signal processing IC 40 and the plurality of device terminals 21 are wire-bonded by the wires 52.

Figure 13A:
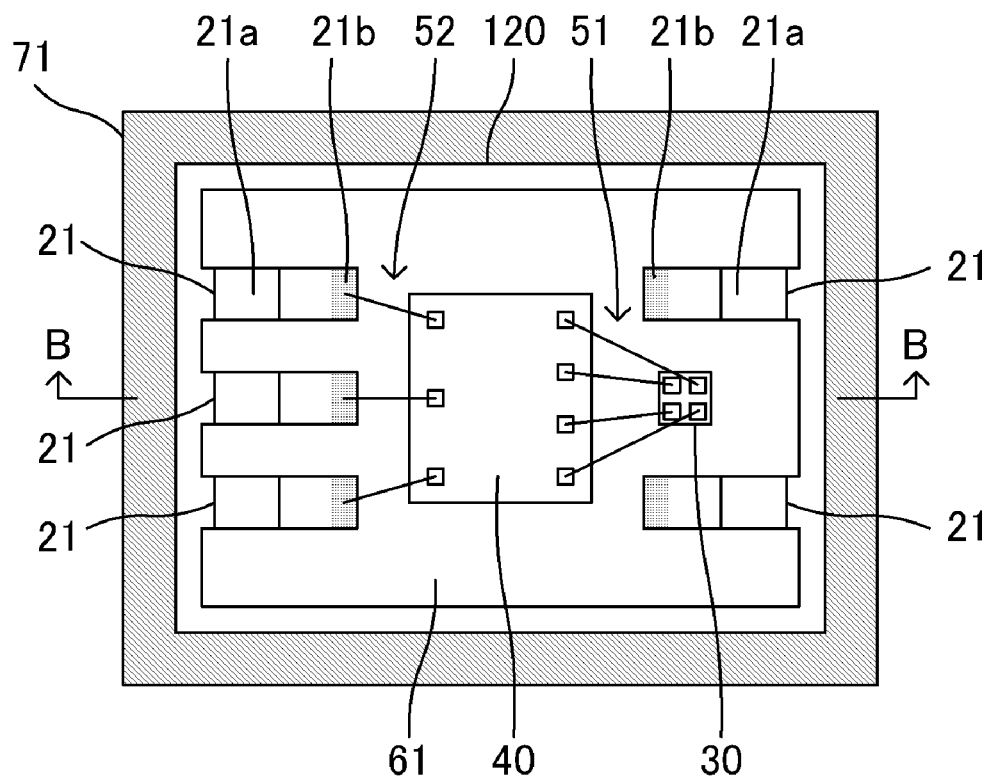
FIG. 13A shows a state of the Hall IC formed through one step in the Hall IC manufacturing processes, that is, a state where the upper surface sides of the lead frame, magnetic sensor and signal processing IC are sealed in by a first sealing member, the figure showing a cross section taken along a reference line AA in FIG. 13B.
Figure 13B:
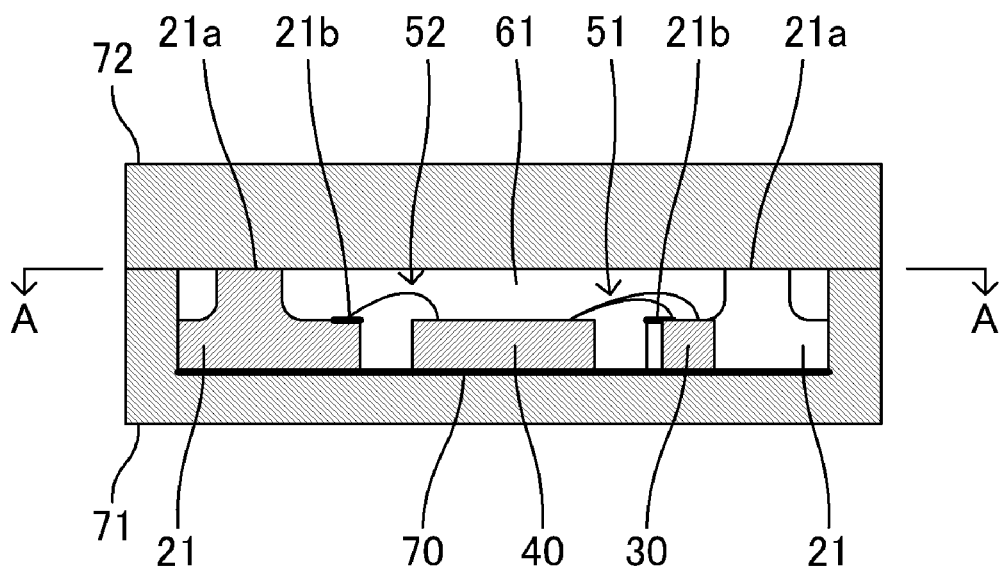
FIG. 13B shows a cross section of the Hall IC taken along a reference line BB in FIG. 13A.

At Step S208, the upper surface sides including at least the upper surfaces of the lead frame 120, magnetic sensor 30 and signal processing IC 40 (in the present example, the side surfaces are included in addition to the upper surfaces, but only the upper surfaces may be included, or part of the side surfaces may be included in addition to the upper surfaces) are sealed in by the first sealing member 61. As shown in FIG. 13A and FIG. 13B, the lead frame 120 in which the magnetic sensor 30 and signal processing IC 40 are arranged on the support member 70 is housed in a box-shaped mold 71 with an open upper surface, a tabular lid 72 is pressed against the mold 71 to close the inner space of the mold 71 including the lead frame 120, and a sealing member is poured into the mold 71 through a through hole (not illustrated) of the mold 71. Here, as the first sealing member 61, resin such as epoxy can be employed. In addition, as the first sealing member 61, resin including fillers may be employed. Furthermore, in order to prevent resin-bleed onto the upper surfaces 21a of the device terminals 21, a surface of the lid 72 on the mold 71 side may be covered by a resin film (for example, a Teflon (registered trademark) film).

At Step S210, the support member 70 is removed from the lead frame 120. The lead frame 120 the upper surface side of which is sealed in by the first sealing member 61 is taken out of the mold 71, and turned upside down, and the support member 70 is peeled off from the bottom surface of the lead frame 120.

At Step S212, the respective bottom surfaces of (the portions of the plurality of device terminals 21 of) the lead frame 120 from which the support member 70 is removed, the magnetic sensor 30, the signal processing IC 40 and the first sealing member 61 are roughened. Here, as a method of roughening, for example, wet-blasting or plasma treatment can be employed.

Figure 14A:
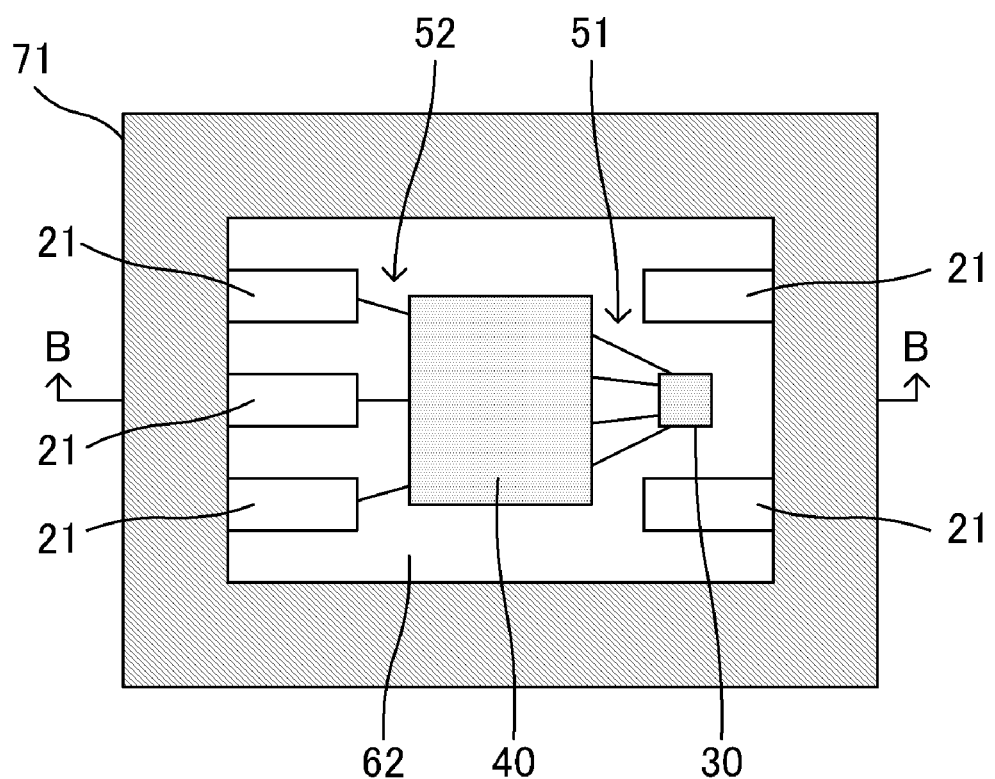
FIG. 14A shows a state of the Hall IC formed through one step in the Hall IC manufacturing processes, that is, a state where the bottom surface sides of the lead frame, magnetic sensor and signal processing IC, from which the support member is removed, are sealed in by a second sealing member, the figure showing a cross section taken along a reference line AA in FIG. 14B.
Figure 14B:
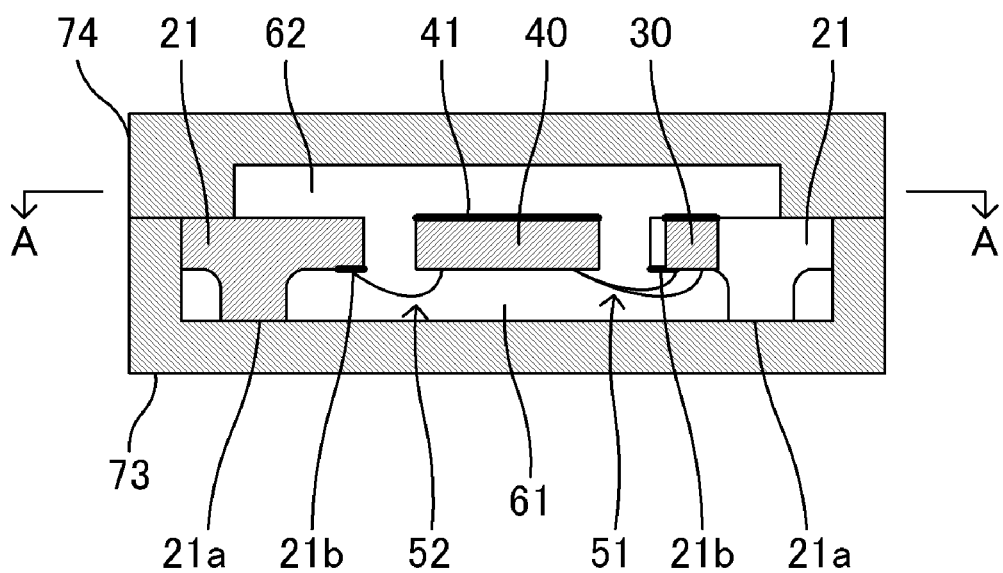
FIG. 14B shows a cross section of the Hall IC taken along a reference line BB in FIG. 14A.

At Step S214, the bottom surface sides including at least the bottom surfaces of the lead frame 120, magnetic sensor 30 and signal processing IC 40 (in the present example, only the bottom surfaces are included, but if the upper surface sides including only the upper surfaces or including part of the side surfaces in addition to the upper surfaces are sealed in by the first sealing member 61 at Step S208, the side surfaces or the remaining portions of the side surfaces are included in addition to the bottom surfaces) are sealed in by the second sealing member 62. Before performing post-curing of the first sealing member 61 shaped at Step S208, as shown in FIG. 14A and FIG. 14B, the lead frame 120 having a roughened bottom surface which has been turned upside down is housed in a box-shaped mold 73 with an open upper surface, a box-shaped mold 74 with an open bottom surface is pressed against the mold 73 to close the inner space of the mold 74 with the bottom surface of the lead frame 120, and the second sealing member 62 is poured into the mold 74 through a through hole (not illustrated) of the mold 74.

At Step S216, post-curing of the first and second sealing members 61, 62 is performed. Thereby, the boundary portions of the first and second sealing members 61, 62 are integrated by the first and second sealing members 61, 62 and post-cured, so the package 60 is formed at a reduced rate of uncured portions. The package 60 seals therein the magnetic sensor 30 and signal processing IC 40 separately from the plurality of device terminals 21 included in the lead frame 20, while the frames of the lead frame 120 and the portions linking the frames with the plurality of device terminals 21 are left unsealed in.

Figure 15A:
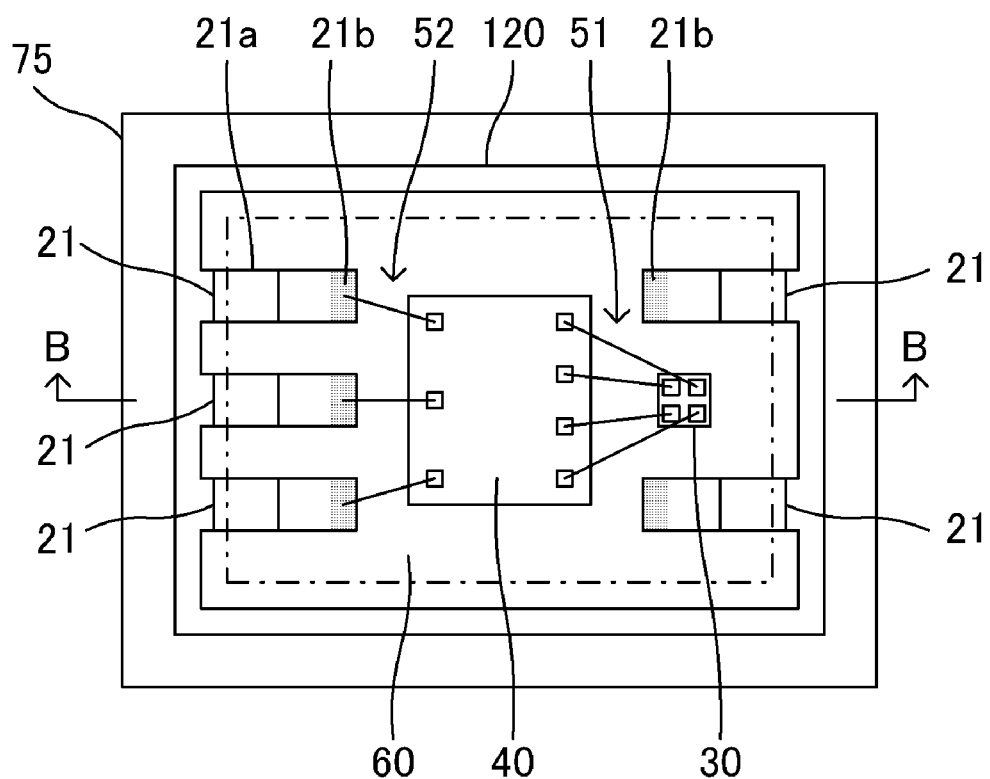
FIG. 15A shows a state of the Hall IC formed through one step in the Hall IC manufacturing processes, that is, a state where the lead frame, magnetic sensor and signal processing IC are packaged by the sealing members.
Figure 15B:
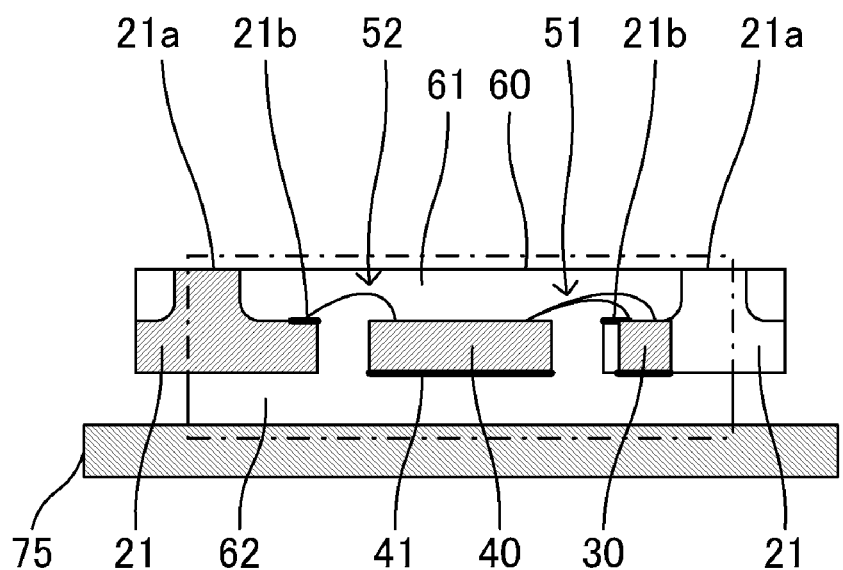
FIG. 15B shows a cross section of the Hall IC taken along a reference line BB in FIG. 15A.

At Step S218, the package 60 is diced. As shown in FIG. 15A and FIG. 15B, the package 60 is turned upside down and is pasted onto a dicing tape 75, and patterns exposed out of the package 60, that is, the portions linking the frames of the lead frame 120 with the plurality of device terminals 21 are cut off together with the outer edge of the first sealing member 61. Thereby, the upper surfaces 21a of the plurality of device terminals 21 are exposed flush at the upper surface of the package 60 to form connecting terminals, thereby completing the Hall IC 111.

According to the method of manufacturing the Hall IC 111 according to the variant: the lead frame 120 including the plurality of device terminals 21, the magnetic sensor 30 and the signal processing IC 40 are arranged separately from each other on the support member 70; the upper surface sides including at least their respective upper surfaces are sealed in by the first sealing member 61; and after the support member 70 is removed, the bottom surface sides including their respective bottom surfaces other than their upper surface sides are sealed in by the second sealing member 62. Thereby, the package 60 formed of the integrated first and second sealing members 61, 62 separates from each other the magnetic sensor 30 and the signal processing IC 40 that processes output signals from the magnetic sensor 30 and also covers and seals in their respective entire outer surfaces, and interfaces that can spread in the package 60, in which the magnetic sensor 30 and signal processing IC 40 are embedded, from its boundaries with them are not formed; therefore, a high withstand voltage can be obtained.

The Hall sensor 110 according to the variant also can be manufactured by the method which is the same as the method of manufacturing the Hall IC 111. However, at Step S204, the signal processing IC 40 may not be installed inside the lead frame 120, and corresponding to this, the processes related to the signal processing IC 40 may be omitted at Step S206 to S218.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As is obvious from the explanation provided above, according to embodiments of the present invention, a magnetic detection device, a current detection device, a magnetic detection device manufacturing method and a current detection device manufacturing method can be realized.

What is claimed is:

1. A current detection device comprising:
a conductor;
a magnetic sensor that detects a magnetic field generated by current flowing through the conductor;
a signal processing IC that processes signals output by the magnetic sensor;
a wire laid across the magnetic sensor and the signal processing IC, wherein a part of the conductor is positioned between the magnetic sensor and the signal processing IC; and
a sealing member that covers and seals all outer surfaces of the magnetic sensor and the wire,
wherein
the sealing member has a first sealing member being arranged in one surface side of the magnetic sensor and extending in the one surface and a second sealing member being arranged in another surface side of the magnetic sensor and extending in the other surface direction, the first and second sealing members having insulation properties,
the first sealing member seals the one surface side of the magnetic sensor and the wire, and
the second sealing member seals the other surface side of the magnetic sensor and does not seal the wire.

2. The current detection device according to claim 1 wherein the magnetic sensor has a roughened first insulating member at a bottom surface thereof.

3. The current detection device according to claim 2, wherein the first insulating member is a die attach film.

4. The current detection device according to claim 1, wherein the sealing member further separates the signal processing IC chip from the magnetic sensor and covers and seals in an outer surface of the signal processing IC chip.

5. The current detection device according to claim 4, wherein the signal processing IC chip has a roughened second insulating member at a bottom surface thereof.

6. The current detection device according to claim 5, wherein the second insulating member is a die attach film.

7. The current detection device according to claim 1, wherein
the magnetic sensor further has:
a magnetic detection element; and
a signal processing circuit that is formed on a semiconductor substrate on which the magnetic detection element is formed as well and processes a signal output by the magnetic detection element.

8. The current detection device according to claim 1 wherein
the sealing member seals in at least part of the conductor to separate the magnetic sensor from the conductor.

9. The current detection device according to claim 8, wherein the conductor has a roughened bottom surface.

10. A current detection device comprising:
a conductor that has a roughened bottom surface and through which measurement-target current flows;
a magnetic sensor that detects a magnetic field generated by current flowing through the conductor;
a signal processing IC that processes signals output by the magnetic sensor;
a wire laid across the magnetic sensor and the signal processing IC, wherein a part of the conductor is positioned between the magnetic sensor and the signal processing IC; and
a sealing member that seals at least part of the conductor, the magnetic sensor and the wire,
wherein
the sealing member has a first sealing member being arranged in one surface side of the magnetic sensor and extending in the one surface and a second sealing member being arranged in another surface side of the magnetic sensor and extending in the other surface direction, the first and second sealing members having insulation properties,
the first sealing member seals the one surface side of the magnetic sensor and the wire, and
the second sealing member seals the other surface side of the magnetic sensor and does not seal the wire.

* * * * *